(12) United States Patent
Shimazawa et al.

(10) Patent No.: US 8,254,214 B2
(45) Date of Patent: Aug. 28, 2012

(54) LIGHT SOURCE UNIT FOR THERMALLY-ASSISTED MAGNETIC RECORDING INCLUDING DUAL ELECTRODE LAYERS CONNECTED TO A UNIT ELECTRODE

(75) Inventors: Koji Shimazawa, Tokyo (JP); Yasuhiro Ito, Tokyo (JP); Osamu Shindo, Tokyo (JP); Ryuji Fujii, Shatin (HK)

(73) Assignee: TDK Corporation, Tokyo (JP)

( * ) Notice: Subject to any disclaimer, the term of this patent is extended or adjusted under 35 U.S.C. 154(b) by 339 days.

(21) Appl. No.: 12/628,761

(22) Filed: Dec. 1, 2009

(65) Prior Publication Data

US 2011/0128827 A1 Jun. 2, 2011

(51) Int. Cl.
*G11B 11/00* (2006.01)
(52) U.S. Cl. .................... 369/13.33; 369/13.13
(58) Field of Classification Search .............. 369/13.33, 369/13.13, 13.32, 13.02, 13.17, 112.09, 112.14, 369/112.21, 112.27; 360/59; 385/129, 31, 385/88–94; 29/603.01–603.27; 250/201.3, 250/201.5
See application file for complete search history.

(56) References Cited

U.S. PATENT DOCUMENTS

| | | |
|---|---|---|
| 6,499,888 B1 | 12/2002 | Wu |
| 7,330,404 B2 | 2/2008 | Peng et al. |
| 7,454,095 B2 | 11/2008 | Baehr-Jones et al. |
| 7,538,978 B2 | 5/2009 | Sato et al. |
| 7,804,655 B2 | 9/2010 | Shimazawa et al. |
| 2005/0213436 A1 | 9/2005 | Ono et al. |
| 2006/0187564 A1 | 8/2006 | Sato et al. |
| 2007/0177302 A1 | 8/2007 | Shimazawa et al. |
| 2008/0043360 A1 | 2/2008 | Shimazawa et al. |
| 2008/0056073 A1 | 3/2008 | Shimizu |
| 2009/0052078 A1 | 2/2009 | Tanaka et al. |
| 2009/0262448 A1 | 10/2009 | Shimazawa et al. |
| 2009/0266789 A1 | 10/2009 | Shimazawa et al. |
| 2010/0085846 A1* | 4/2010 | Shimazawa et al. ....... 369/13.33 |
| 2010/0097724 A1* | 4/2010 | Shimazawa et al. ....... 369/13.33 |
| 2011/0116349 A1* | 5/2011 | Komura et al. ............. 369/13.33 |
| 2011/0157738 A1* | 6/2011 | Shimazawa et al. ....... 369/13.33 |

(Continued)

FOREIGN PATENT DOCUMENTS

JP A-11-185232 7/1999
JP A-2008-152869 7/2008

OTHER PUBLICATIONS

Dec. 1, 2010 Office Action issued in U.S. Appl. No. 12/246,216.

(Continued)

*Primary Examiner* — Tan X Dinh
(74) *Attorney, Agent, or Firm* — Oliff & Berridge, PLC

(57) ABSTRACT

Provided is a light source unit the weight of which can be reduced while ensuring power supply to the light source. The light source is configured to form a thermally-assisted magnetic recording head by being joined with a slider including an optical system that propagates light for thermal assist. The light source unit comprises: a unit substrate including a joining surface that faces an power-supply electrode of the slider; a first electrode provided on the joining surface; a second electrode provided on a source-installation surface and electrically connected to the first electrode; and a light source that includes two electrode layers and a light-emission center located in a light-emitting surface. The first and second electrodes eliminate the provision of a terminal electrode for light source on the source-integration surface. As a result, the weight of the light source unit can be reduced.

10 Claims, 8 Drawing Sheets

U.S. PATENT DOCUMENTS

2011/0228653 A1* 9/2011 Shimazawa et al. ....... 369/13.32
2011/0242697 A1* 10/2011 Mori et al. ................. 369/13.33

OTHER PUBLICATIONS

Oct. 17, 2011 Office Action issued in U.S. Appl. No. 12/728,510.
Hochberg, Michael et al., "Integrated Plasmon and Dielectric Waveguides," Optics Express, Nov. 2004, pp. 5481-5486, vol. 12—No. 22.
Rottmayer, Robert et al., "Heat-Assisted Magnetic Recording," IEEE Transactions on Magnetics, Oct. 2006, pp. 2417-2421, vol. 42—No. 10.
U.S. Appl. No. 12/246,216, filed Oct. 6, 2008 in the name of Koji Shimazawa et al.

* cited by examiner

LIGHT SOURCE UNIT FOR THERMALLY-ASSISTED MAGNETIC RECORDING INCLUDING DUAL ELECTRODE LAYERS CONNECTED TO A UNIT ELECTRODE

BACKGROUND OF THE INVENTION

1. Field of the Invention

The present invention relates to a light source unit including a light source for performing thermally-assisted magnetic recording, and to a magnetic recording head provided with the light source unit. Further, the present invention relates to a method for manufacturing the light source unit.

2. Description of the Related Art

As the recording densities of magnetic recording apparatuses become higher, as represented by magnetic disk apparatuses, further improvement has been required in the performance of thin-film magnetic heads and magnetic recording media. As the thin-film magnetic heads, a composite-type thin-film magnetic head is widely used, which has a stacked structure of a magnetoresistive (MR) element for reading data and an electromagnetic transducer for writing data.

Whereas, the magnetic recording medium is generally a kind of discontinuous body of magnetic grains gathered together, and each of the magnetic grains has a single magnetic domain structure. Here, one record bit consists of a plurality of the magnetic grains. Therefore, in order to improve the recording density, it is necessary to decrease the size of the magnetic grains and reduce irregularity in the boundary of the record bit. However, the decrease in size of the magnetic grains raises a problem of degradation in thermal stability of the magnetization due to the decrease in volume.

As a measure against the thermal stability problem, it may be possible to increase the magnetic anisotropy energy $K_U$ of the magnetic grains. However, the increase in energy $K_U$ causes the increase in anisotropic magnetic field (coercive force) of the magnetic recording medium. Whereas, the intensity of write field generated from the thin-film magnetic head is limited almost by the amount of saturation magnetic flux density of the soft-magnetic material of which the magnetic core of the head is formed. As a result, the head cannot write data to the magnetic recording medium when the anisotropic magnetic field of the medium exceeds the write field limit.

Recently, as a method for solving the problem of thermal stability, so-called a thermally-assisted magnetic recording technique is proposed. In the technique, a magnetic recording medium formed of a magnetic material with a large energy $K_U$ is used so as to stabilize the magnetization, then anisotropic magnetic field of a portion of the medium, where data is to be written, is reduced by heating the portion; just after that, writing is performed by applying write field to the heated portion.

In this thermally-assisted magnetic recording technique, there has been generally used a method in which a magnetic recording medium is irradiated and thus heated with a light such as near-field light. In this case, it is significantly important to stably supply a light with a sufficiently high intensity at a desired position on the magnetic recording medium. However, from the beginning, more significant problem to be solved exists in where and how a light source with a sufficiently high output of light should be disposed inside a head.

As for the setting of the light source, for example, U.S. Pat. No. 7,538,978 B2 discloses a configuration in which a laser unit including a laser diode is mounted on the back surface of a slider, and US Patent Publication No. 2008/0056073 A1 discloses a configuration in which a structure of a laser diode element with a monolithically integrated reflection mirror is mounted on the back surface of a slider. Further, US Patent Publication No. 2005/0213436 A1 discloses a structure of slider that is formed together with a semiconductor laser, and Robert E. Rottmayer et al. "Heat-Assisted Magnetic Recording" IEEE TRANSACTIONS ON MAGNETICS, Vol. 42, No. 10, p. 2417-2421 (2006) discloses a configuration in which a diffraction grating is irradiated with a light generated from a laser unit provided within a drive apparatus.

As described above, various types of the setting of the light source are suggested. However, the present inventors propose a thermally-assisted magnetic recording head with a "composite slider structure" which is constituted by joining a light source unit provided with a light source to the end surface (back surface) of a slider provided with a write head element, the end surface being opposite to the opposed-to-medium surface of the slider. The "composite slider structure" is disclosed in, for example, US Patent Publication No. 2008/043360 A1 and US Patent Publication No. 2009/052078 A1. The advantages of the thermally-assisted magnetic recording head with the "composite slider structure" are as follows:

a) The head has an affinity with the conventional manufacturing method of thin-film magnetic heads because the opposed-to-medium surface and the element-integration surface are perpendicular to each other in the slider.

b) The light source can avoid suffering mechanical shock directly during operation because the light source is provided far from the opposed-to-medium surface.

c) The light source such as a laser diode and the head elements can be evaluated independently of each other; thus the degradation of manufacturing yield for obtaining the whole head can be avoided; whereas, in the case that all the light source and head elements are provided within the slider, the manufacturing yield rate for obtaining the whole head is likely to decrease significantly due to the multiplication of the process yield for the light-source and the process yield for the head elements.

d) The head can be manufactured with reduced man-hour and at low cost, because of no need to provide the head with optical components such as a lens or prism which are required to have much high accuracy, or with optical elements having a special structure for connecting optical fibers or the like.

There are two factors in improving the performance of a head having such a "composite slider structure". One is reduction of tact time required for production of the head, in particular, production of a light source unit, and reduction of the cost of the production process.

In practice, a light source unit is fabricated by joining a light source such as a laser diode onto a unit substrate. A head is fabricated by coupling the light source unit to a slider. It is known that the distance between the light-emission center located in the light-emitting surface of the light source that emits light and a light-receiving end surface of an optical system such as a waveguide located on the back surface of the slider needs to be controlled to 10 μm (micrometers) or less in the production processes in order to provide a sufficiently high light use efficiency. Therefore the positional accuracy in joining the light source onto the unit substrate in the first place is critical. Furthermore, in order to avoid damage to the light source, the light-emitting surface of the light source should not protrude from the light source unit, of course. The production process of the light source unit that meets these requirements generally requires a considerably high mounting accuracy, and thus a very sophisticated image recognition technology and a highly accurate positioning mechanism. Consequently, a considerably expensive production facility is required for the production, and the tact time required for the production also tends to increase. Accordingly, per-head-chip cost can increase.

The other factor in improving the performance of the "composite slider structure" head is reduction of the weight of the light source unit. The light source unit is mounted on the slider and is mounted on a suspension as the head. To maintain and enhance the flying performance and impact resistance of the head in operation, it is important to sufficiently reduce the weight of the light source unit. US Patent Publication No. 2008/043360 A1 and US Patent Publication No. 2009/052078 A1 described above disclose the source-installation surface of the unit substrate on which terminal electrodes for the light source are provided. The source-installation surface needs the provision of at least an area where the light source is to be bonded and an area to be occupied by the terminal electrodes for the light source, which limits the reduction of the volume of the unit substrate to reduce the weight. Therefore, there is a need to reduce the weight of the light source unit while ensuring power supply to the light source.

SUMMARY OF THE INVENTION

Some terms used in the specification will be defined before explaining the present invention. In a layered structure or an element structure formed in the element-integration surface of a slider substrate or in the source-installation surface of a unit substrate of the magnetic recording head according to the present invention, when viewed from a standard layer or element, a substrate side is defined as "lower" side, and the opposite side as an "upper" side. Further, "X-, Y- and Z-axis directions" are indicated in some figures showing embodiments of the head according to the present invention as needed. Here, Z-axis direction indicates above-described "up-and-low" direction, and +Z side corresponds to a trailing side and −Z side to a leading side. And Y-axis direction indicates a track width direction, and X-axis direction indicates a height direction.

Further, a "side surface" of a waveguide provided within the magnetic recording head is defined as an end surface other than the end surfaces perpendicular to the direction in which light propagates within the waveguide (−X direction), out of all the end surfaces surrounding the waveguide. According to the definition, an "upper surface" and a "lower surface" are one of the "side surfaces". The "side surface" is a surface on which the propagating light can be totally reflected within the waveguide corresponding to a core.

According to the present invention, there provided is a light source unit configured to form a thermally-assisted magnetic recording head by being joined with a slider including an optical system that is provided in an element-integration surface of a slider substrate and propagates a light for thermal assist. The light source unit comprises:

a unit substrate including a joining surface that faces an electrode for power supply when the light source unit is joined to the slider, the electrode for power supply being provided on the side opposite to an opposed-to-medium surface of the slider substrate;

a first electrode provided on the joining surface and a second electrode provided on a source-installation surface adjacent to the joining surface and electrically connected to the first electrode; and a light source including two electrode layers and a light-emission center that is located in a light-emitting surface adjacent to each of the two electrode layers and emits a light to be entered into the optical system, the light source being provided by bonding one of the two electrode layers onto the second electrode.

In the light source unit according to the present invention, there is no need to provide a terminal electrode for light source on the source-integration surface because of the provision of the first and second electrodes. As a result, the weight of the light source unit can be reduced while ensuring power supply to the light source. Here, the light source is preferably an edge-emitting laser diode, and it is preferable that the light source is provided by bonding an electrode layer of the two electrode layers onto the second electrode, the electrode layer being opposite to a ridge structure. In the case, alignment of the light source and the unit substrate that comprises the first and second electrodes can be performed by means of a positioning jig having a flat surface without butting the light-emission center of the light source against the flat surface of the positioning jig.

Further, in the light source unit according to the present invention, it is preferable that a distance $D_{REC}$ between a surface that includes the light-emission center of the light source and a surface of the first electrode in a direction perpendicular to the first electrode surface is zero or more, and 5 micrometers (µm) or less. Since the distance $D_{REC}$ is greater than or equal to 0, the light-emitting surface of the light source does not protrude from the light source unit. Consequently, the light source is prevented from being subjected to excessive mechanical stress and damage during bonding. Furthermore, since the direction $D_{REC}$ is less than or equal to 5 µm, the distance between the light-emission center and the light-receiving end surface of the optical system disposed on the back surface of the slider is sufficiently small and therefore a high light use efficiency can be provided.

Furthermore, in the light source unit according to the present invention, a plurality of grooves extending in a track width direction is preferably provided in the first electrode. The grooves cause the light source unit and the slider to be joined favorably by Au—Au ultrasonic joining. Further, it is preferable that the unit substrate in a track width direction is greater than or equal to a width of the light source in the track width direction, and less than or equal to 1.5 times the width of the light source in the track width direction.

According to the present invention, a thermally-assisted magnetic recording head is further provided, which comprises:

a slider including: an optical system that is provided in an element-integration surface of a slider substrate and propagates a light for thermal assist; a write head element that is provided in the element integration surface and writes data on a magnetic recording medium; and an electrode for power supply provided on a side opposite to an opposed-to-medium surface of the slider substrate; and the light source unit as claimed in claim 1 joined with the slider by bonding the power-supply electrode of the slider onto the first electrode in such a manner that a light emitted from the light-emission center enters the optical system.

In the above-described head, it is preferable that terminal electrodes for the write head element and a terminal electrode for the light source electrically connected with the power-supply electrode are provided on a side opposite to the opposed-to-medium surface of the slider substrate.

According to the present invention, a head gimbal assembly (HGA) is provided, which comprises a suspension and the above-described thermally-assisted magnetic recording head that is fixed to the suspension and comprises a terminal electrode for the light source electrically connected with the power-supply electrode.

a portion of an end surface of the slider substrate opposite to the opposed-to-medium surface being bonded to the suspension, the suspension comprising an aperture, the light source unit protruding from the aperture on a side opposite to the slider in relation to the suspension, and a wiring member being provided on a surface of the suspension on the slider side, one end of the wiring member being electrically connected with the terminal electrodes for the write head element and the terminal electrode for the light source.

According to the present invention, a magnetic recording apparatus is further provided, which comprises: at least one HGA as described above; at least one magnetic recording medium; and a control circuit configured to control write operations that the thermally-assisted magnetic recording head performs to the at least one magnetic recording medium, and to control light-emission operations of the light source.

According to the present invention, there provided is a method for manufacturing the above-described light source unit in which the light source is an edge-emitting laser diode and is provided by bonding an electrode layer of the two electrode layers onto the second electrode, the electrode layer being opposite to a ridge structure, the method comprising the steps of:

placing the light source on the unit substrate on which the first and second electrodes have been formed, in such a manner that the electrode layer positioned on the side opposite to the ridge structure faces the second electrode;

positioning the light source and the unit substrate relative to each other by butting a portion of the light-emitting surface of the light source on the unit substrate side and at least a portion of a surface of the first electrode against a flat surface of a positioning jig, the portion of the light-emitting surface not including the light-emission center; and bonding the positioned light source and the unit substrate to each other.

In the manufacturing method of the light source unit according to the present invention, because a positioning jig comprising a flat surface is used and the electrode layer of the light source opposite to the ridge structure and the second electrode are bonded to each other, a portion of the light-emitting surface can be easily butted against the flat surface while preventing the light-emission center from hitting the flat surface. Consequently, the positioning of the light source and the unit substrate relative to each other can be accomplished with a high degree of accuracy without applying an excessive mechanical stress to the light source. Therefore, the light-emission center and the light-receiving end surface of the optical system can be disposed sufficiently close to each other in the completed thermally-assisted magnetic recording head. As a result, a sufficiently high light use efficiency is achieved.

Further, the above-explained positioning does not need any sophisticated image recognition technology or high-precision positioning mechanism. Consequently, the production does not require so expensive a facility or prolonged tact time for production. Therefore, the per-head-chip production cost can be kept sufficiently low.

Further objects and advantages of the present invention will be apparent from the following description of preferred embodiments of the invention as illustrated in the accompanying figures. In each figure, the same element as an element shown in other figure is indicated by the same reference numeral. Further, the ratio of dimensions within an element and between elements becomes arbitrary for viewability.

DESCRIPTION OF THE PREFERRED EMBODIMENTS

Figure 1:
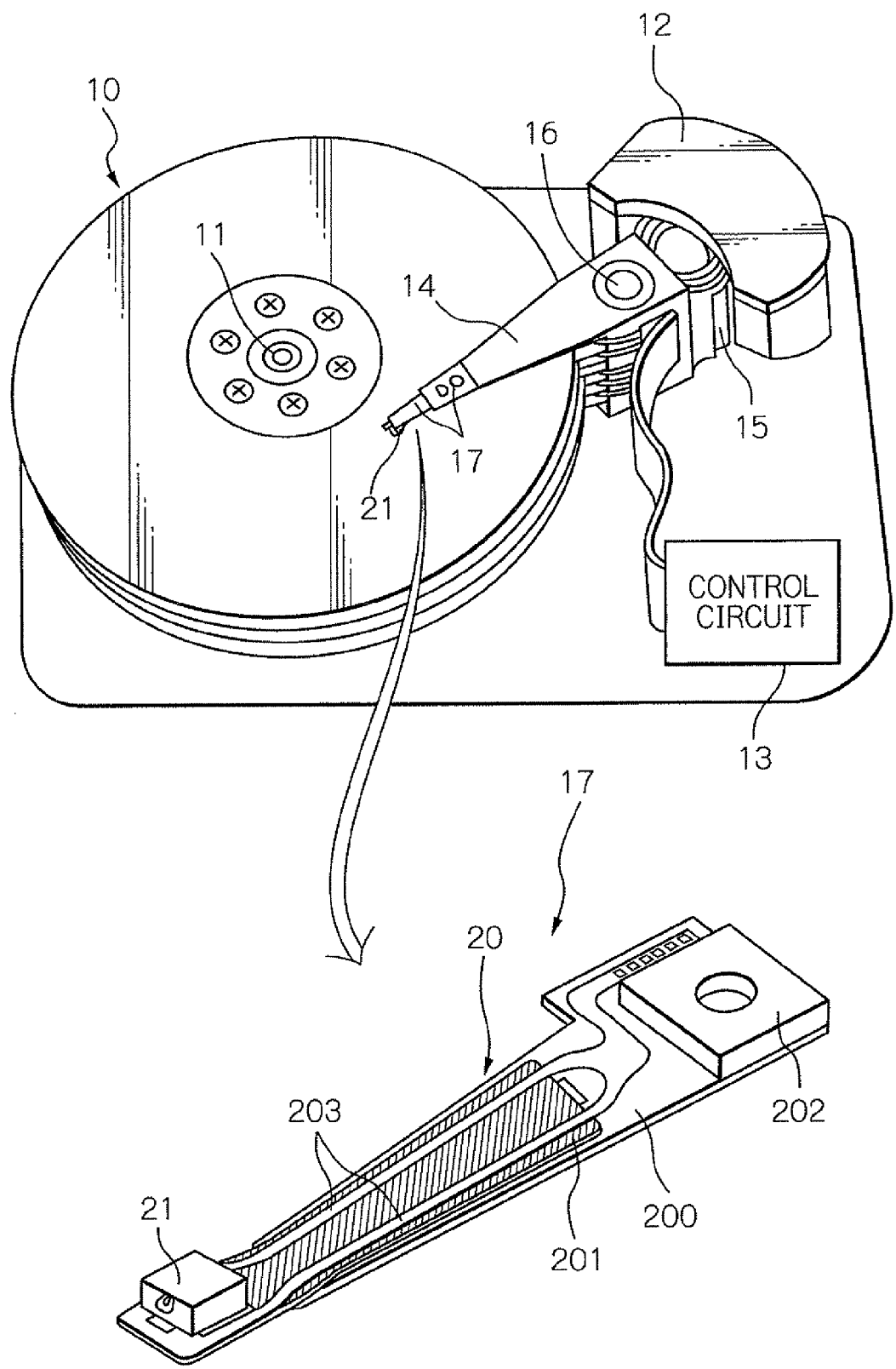
FIG. 1 shows a perspective view schematically illustrating a structure of a major part in one embodiment of a magnetic recording apparatus and a head gimbal assembly (HGA) according to the present invention.

FIG. 1 shows a perspective view schematically illustrating a structure of a major part in one embodiment of a magnetic recording apparatus and a head gimbal assembly (HGA) according to the present invention. Here, in the perspective view of the HGA, the side of the HGA opposed to the surface of the magnetic disk is presented as the upper side.

A magnetic disk apparatus as a magnetic recording apparatus shown in FIG. 1 includes: a plurality of magnetic disks 10 rotating around a rotational axis of a spindle motor 11; an assembly carriage device 12 provided with a plurality of drive arms 14 thereon; an HGA 17 attached on the top end portion of each drive arm 14 and provided with a thermally-assisted magnetic recording head 21; and a recording/reproducing and light-emission control circuit 13 for controlling write/read operations of the thermally-assisted magnetic recording head 21 and further for controlling the emission operation of a laser diode as a light source that generates laser light for thermally-assisted magnetic recording, which will be described later.

The magnetic disk 10 is, in the present embodiment, designed for perpendicular magnetic recording, and has a structure in which, for example, sequentially stacked on a disk substrate is: a soft-magnetic under layer; an intermediate layer; and a magnetic recording layer (perpendicular magnetization layer). The assembly carriage device 12 is a device for positioning the thermally-assisted magnetic recording head 21 above a track formed on the magnetic recording layer of the magnetic disk 10, on which recording bits are aligned. In the apparatus, the drive arms 14 are stacked in a direction along a pivot bearing axis 16 and can be angularly swung around the axis 16 by a voice coil motor (VCM) 15. The structure of the magnetic disk apparatus according to the present invention is not limited to that described above. For instance, the number of each of magnetic disks 10, drive arms 14, HGAs 17 and sliders 21 may be one.

Referring also to FIG. 1, a suspension 20 in the HGA 17 includes a load beam 200, a flexure 201 with elasticity fixed to the load beam 200, a base plate 202 provided on the base portion of the load beam 200, and a wiring member 203 provided on the flexure 201 and made up of lead conductors and connection pads electrically joined to both ends of the lead conductors. The thermally-assisted magnetic recording head 21 is fixed to the flexure 201 at the top end portion of the suspension 20 so as to face the surface of each magnetic disk 10 with a predetermined space (flying height). Moreover, one ends (connection pads) of the wiring member 203 are electrically connected to terminal electrodes of the thermally-assisted magnetic recording head 21. The structure of the suspension 20 is not limited to the above-described one. An IC chip for driving the head may be mounted midway on the suspension 20, though not shown.

Figure 2:
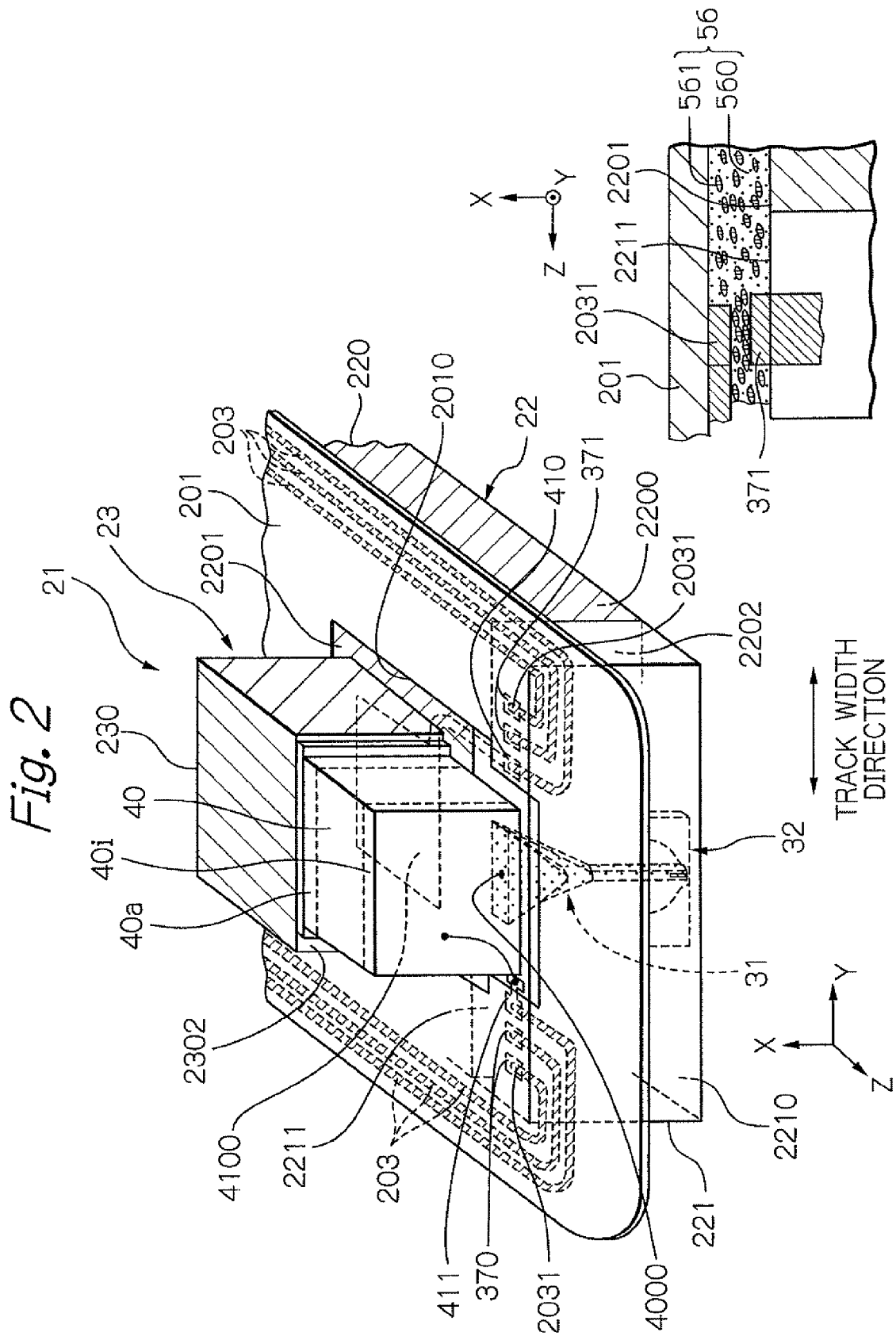
FIG. 2 shows a perspective view and a cross-sectional view schematically illustrating an embodiment in which the thermally-assisted magnetic recording head according to the present invention is attached on the flexure.

FIG. 2 shows a perspective view and a cross-sectional view schematically illustrating an embodiment in which the thermally-assisted magnetic recording head 21 according to the present invention is attached on the flexure 201. In the perspective view, the side of the head 21 opposed to the surface of the magnetic disk is turned downward.

As shown in FIG. 2, the thermally-assisted magnetic recording head 21 is constituted by joining a light source unit 23 including a laser diode 40 as a light source to a slider 22. The slider 22 includes a slider substrate 220 and a head element part 221 provided on the element-integration surface of the slider substrate 220. The head element part 221 includes: an optical system 31 for guiding laser light generated from the laser diode 40 toward the opposed-to-medium surface side and for generating a light (near-field light) for thermal assist; and a head element 32 for writing and reading data. Further, the flexure 201 has an aperture 2010; the light source unit 23 protrudes from the aperture 2010 on the side opposite to the slider 22 in relation to the flexure 201.

Further, the slider 22 includes a pair of terminal electrodes 370 and a pair of terminal electrodes 371, which are provided for the head element 32, and two terminal electrodes 410 and 411 for the laser diode 40. These terminal electrodes 370, 371, 410 and 411 are electrically connected to the connection pads 2031 of the wiring member 203 provided on the flexure 201. The terminal electrode 410 is electrically connected to a back surface electrode 4100 that is provided on the end surface (back surface) 2201 of the slider substrate 220 and is formed of a conductive material such as gold (Au) or Au alloy, the back surface 2201 being opposite to the opposed-to-medium surface (air bearing surface: ABS) 2200 of the slider substrate 220. Further, the terminal electrode 410 is electrically connected to n-electrode layer 40a of the laser diode 40 through the back surface electrode 4100. The terminal electrode 411 is electrically connected to p-electrode layer 40i of the laser diode 40. This connection between the terminal electrodes 411 and the p-electrode layer 40i can be achieved by wire bonding, or by solder ball bonding (SBB) with use of a solder.

Fixing of the head 21 onto the flexure 201 and electrical connection of terminal electrodes 370, 371, 410 and 411 to connection pads 2031 of the wiring member 203 can be performed at a time by using an anisotropic conductive resin 56 as illustrated in the cross-sectional view shown in FIG. 2. The anisotropic conductive resin 56 includes: an adhesive portion 560 made of an ultraviolet (UV) curable resin such as UV curable epoxy resin or UV curable acrylic resin, which hardens on exposure to ultraviolet light, or a thermosetting resin, which hardens when heated; and a conductive filler 561 dispersed in the adhesive portion 560, made of metal particles such as silver (Ag) particles or plastic particles coated with a metal. The anisotropic conductive resin 56 is provided between the flexure 201 and the back surface 2201 of the slider substrate 220 as well as the end surface 2211 of the head element 221, and bonds them together. The anisotropic conductive resin 56 is also provided between each of the terminal electrodes 370, 371, 410 and 411 and the connection pad 2031. The cross-sectional view in FIG. 2 illustrates by an example only the terminal electrode 371 and its surrounding section.

The anisotropic conductive resin 56 contains a minimum amount of the conductive filler 561 in the adhesive portion 560. Accordingly, in the anisotropic conductive resin 56, which fills the space between the back surface 2201 (end surface 2211) and the flexure 201 in the form of a thin layer, the particles of the conductive filler 561 are less likely to come into contact and to link with each other and therefore unlikely to form electrically-conducting path in the direction along the back surface 2201 but come into contact and link with each other to form a electrically-conducting path in the thickness direction (X-axis direction). Consequently, each of the terminal electrodes 370, 371, 410 and 411 can be electrically connected to its corresponding connection pad 2031 without bringing the terminal electrodes 370, 371, 410 and 411 into conduction with each other or the connection pads with each other. The anisotropic conductive resin is described in Japanese Patent Publication No. 11-185232, for example. Each of the terminal electrodes 370, 371, 410 and 411 can be electrically connected to its corresponding connection pad 2031 by using other means, for example wire bonding, instead of the anisotropic conductive resin 56.

In the mode in which the thermally-assisted magnetic recording head 21 is mounted on the flexure 201 as described above, stable fixation and proper electrical connection can be achieved even though the light source unit 23 is protruded from the slider 22. In particular, since the terminal electrodes 370, 371, 410 and 411 of the head 21 are concentrated on the end surface 2211, the wiring member 203, which is electrically connected to these terminal electrodes, needs to be provided only on one of the surfaces of the flexure 201 (that is on the slider side). The arrangement of the wiring member 203 further ensures the electrical connection to the terminal electrodes of the head 21 and also facilitates the fabrication of the HGA, contributing to increase of the production yields.

Figure 3:
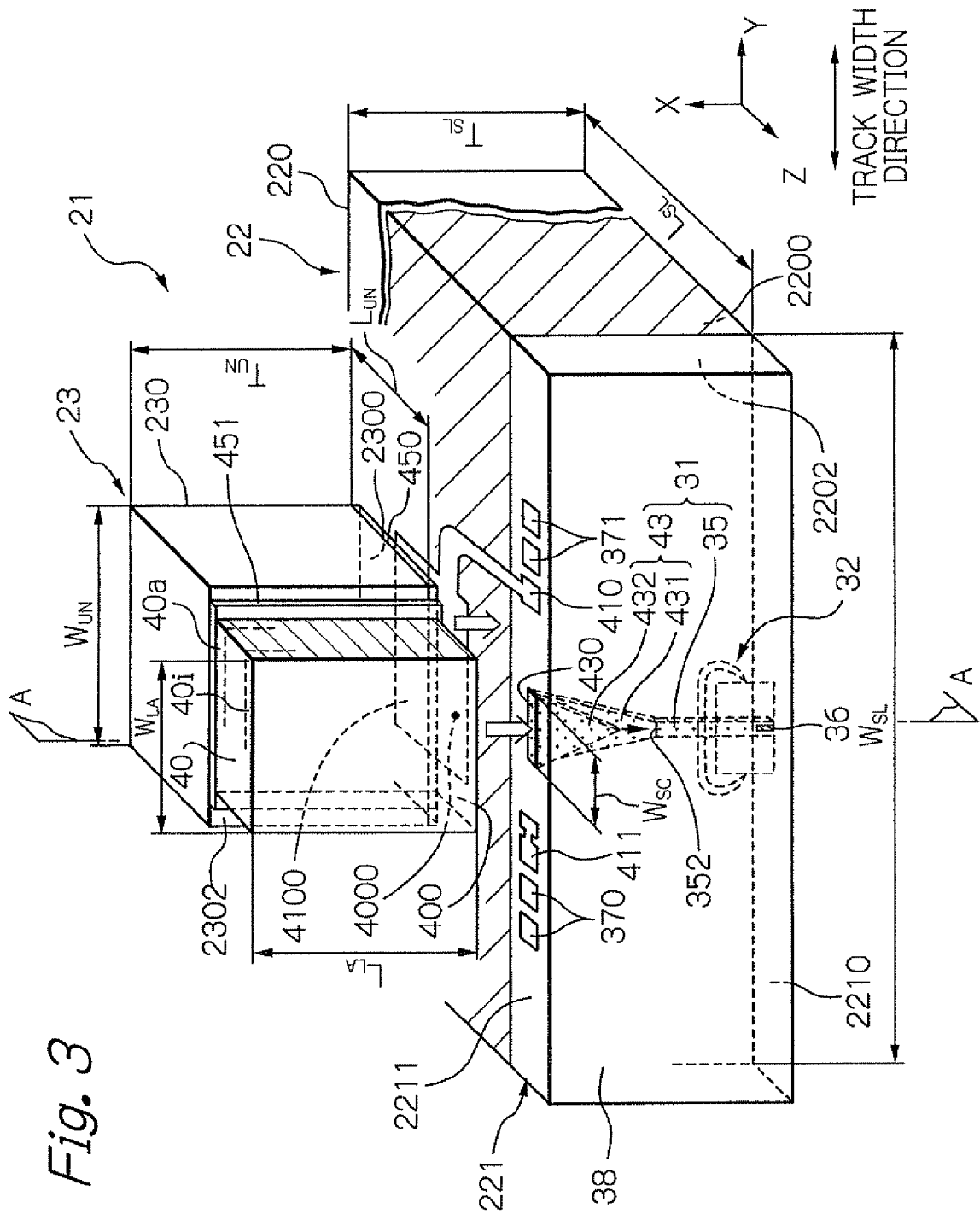
FIG. 3 shows a perspective view illustrating one embodiment of the thermally-assisted magnetic recording head according to the present invention.

FIG. 3 shows a perspective view illustrating one embodiment of the thermally-assisted magnetic recording head 21 according to the present invention.

As shown in FIG. 3, a thermally-assisted magnetic recording head 21 is constituted of the slider 22 and the light source unit 23 as described above. The slider 22 includes: a slider substrate 220 having an ABS 2200 processed so as to provide an appropriate flying height, and formed of, for example, AlTiC ($Al_2O_3$—TiC); and a head element part 221 formed on an element-integration surface 2202 that is perpendicular to and adjacent to the ABS 2200. While, the light source unit 23 includes: a unit substrate 230 having an joining surface 2300, and formed of, for example, AlTiC ($Al_2O_3$—TiC); and a laser diode 40 as a light source provided on a source-installation surface 2302 that is perpendicular to and adjacent to the joining surface 2300. The slider 22 and the light source unit 23 are bonded to each other in such a way that the back surface 2201 of the slider substrate 220 and the joining surface 2300 of the unit substrate 230 are opposed to each other.

In the slider 22, the head element part 221 formed on the element-integration surface 2202 of the slider substrate 220 includes: a head element 32 constituted of a magnetoresistive (MR) element 33 for reading data from the magnetic disk 10 (FIG. 1) and an electromagnetic transducer 34 for writing data to the magnetic disk; a spot-size converter 43 that receives a laser light emitted from the laser diode 40, changes (reduces) the spot size of the laser light, then guides the laser light into the waveguide 35; a waveguide 35 that guides the laser light with changed spot size to the head end surface 2210 or its vicinity; a surface plasmon generator 36 that generates near-field light for thermal assist; and an overcoat layer 38 formed on the element-integration surface 2202 so as to cover the head element 32, the spot-size converter 43, the waveguide 35 and the surface plasmon generator 36. Here, the spot-size converter 43, the waveguide 35 and the surface plasmon generator 36 constitute the optical system 31 for generating near-field light in the head 21.

One ends of the MR element 33, the electromagnetic transducer 34 and the surface plasmon generator 36 reach the head end surface 2210 as an opposed-to-medium surface. Here, the head end surface 2210 and the ABS 2200 constitute the whole opposed-to-medium surface of the thermally-assisted magnetic recording head 21. During actual write and read operations, the thermally-assisted magnetic recording head 21 aerodynamically flies above the surface of the rotating magnetic disk with a predetermined flying height. Thus, the ends of the MR element 33 and electromagnetic transducer 34 face the surface of the magnetic record layer of the magnetic disk 10 with a appropriate magnetic spacing. Then, MR element 33 reads data by sensing signal magnetic field from the magnetic record layer, and the electromagnetic transducer 34 writes data by applying signal magnetic field to the magnetic record layer. When writing data, laser light, which is generated from the laser diode 40 of the light source unit 23 and propagates through the spot-size converter 43 and the waveguide 35, is changed into near-field light in the surface plasmon generator 36. Then, a portion to be written of the magnetic recording layer is irradiated and thus heated with the near-field light. As a result, the anisotropic magnetic field (coercive force) of the portion is decreased to a value that enables writing; thus the thermally-assisted magnetic recording can be achieved.

Referring also to FIG. 3, a spot-size converter 43 is an optical element which receives, at its light-receiving end surface 430 having a width $W_{SC}$ in the track width direction (the Y-axis direction), laser light emitted from the laser diode 40, converts the laser light to laser light with a smaller spot diameter with a low loss while maintaining a single mode, and then guides the converted laser light to a light-receiving end surface 352 of the waveguide 35. The spot-size converter 43 in the present embodiment includes a lower propagation layer 431 and an upper propagation layer 432. The lower propagation layer 431 has a width in the track width direction (the Y-axis direction) that gradually decreases from the width $W_{SC}$ along the traveling direction (−X direction) of laser light incident through the light-receiving end surface 430. The upper propagation layer 432 is stacked on the lower propagation layer 431 and has a width in the track width direction (Y-axis direction) that more steeply decreases from the width $W_{SC}$ along the traveling direction (−X direction) of laser light than the lower propagation layer 431. Laser light incident through the light-receiving end surface 430 is converted to laser light with a smaller spot size as the laser light propagates through the layered structure, and reaches the light-receiving end surface 352 of the waveguide 35.

The width $W_{SC}$ of the spot-size converter 43 at the light-receiving end surface 430 may be in the range of approximately 1 to 10 μm (micrometers), for example. The thickness $T_{SC}$ (in Z-axis direction) at the light-receiving end surface 430 may be in the range of approximately 1 to 10 μm, for example. The light-receiving end surface 430 is preferably inclined at a predetermined acute angle, for example at an angle of approximately 4 degrees with respect to the end surface 400 including the light-emission center 4000 of the laser diode 40. Such angle prevents laser light reflected by the light-receiving end surface 430 from returning to the light-emission center 4000. The spot-size converter 43 is made of a material with a refractive index higher than the refractive index $n_{OC}$ of the constituent material of the surrounding overcoat layer 38. The spot-size converter 43 can be formed from the same dielectric material as the waveguide 35, which will be described below. In the case, the spot-size converter 43 and the waveguide 35 may be formed integrally.

The waveguide 35 in the present embodiment extends in parallel with the element-integration surface 2202 from the light-receiving end surface 352 that receives laser light emitted from the spot-size converter 43 to the end surface 350 on the head end surface 2210 side. One side surface of the waveguide 35 near the end surface 350 faces a surface plasmon generator 36. This allows laser light (waveguide light) incident through the light-receiving end surface 352 and traveling through the waveguide 35 to reach the portion facing the surface plasmon generator 36.

Referring again to FIG. 3, the light source unit 23 includes: a unit substrate 230 having a bonding surface 2300; and a laser diode 40 provided on the source-installation surface 2302 which is perpendicular to and adjacent to the joining surface 2300 of the unit substrate 230. A first unit electrode 450 is provided on the joining surface 2300 of the unit substrate 230, and a second unit electrode 451 is provided on the source-installation surface 2302 of the unit substrate 230. The first unit electrode 450 and the second unit electrode 451 cover the two respective adjacent end surfaces of the unit substrate 230 so that the first and second unit electrodes 450 and 451 are electrically interconnected and form an integral electrode. The first and second unit electrodes 450 and 451 may be formed by a foundation layer of a material such as Ta or Ti with a thickness of approximately 10 nm (nanometers), for example, and a conducting layer of a conductive material such as gold (Au), copper (Cu) or an alloy of Au with a thickness in the range of approximately 1 to 5 μm, for example. In an alternative, the second unit electrode 451 may be formed by depositing a solder material such as Au—Sn alloy on the source-installation surface 2302 by an evaporation method, for example. The back surface electrode 4100 can be provided on the back surface 2201 of the slider 22 by forming a layered structure like the first and second unit electrodes 450 and 451 described above. The terminal electrodes 370, 371, 410 and 411 can be provided by forming a layered structure like the first and second unit electrodes 450 and 451 described above on an overcoat layer formed on the element-integration surface 2202 and exposing one end of the layered structure in the head end surface 2211. The terminal electrodes 410 and 411 may also be provided by forming a layered structure like the first and second unit electrodes 450 and 451 described above on the head end surface 2211 of the slider 22.

The laser diode 40 is provided on the source-installation surface 2302 in such a manner that an n-electrode layer 40a and the second unit electrode 451 are bonded together and electrically interconnected. The light source unit 23 on which the laser diode 40 is mounted is mounted on the slider 22 in such a manner that the first unit electrode 450 and the back surface electrode 4100 provided on the back surface 2201 of the slider substrate 220 are bonded together and electrically interconnected. Accordingly, the terminal electrode 410 provided on the head end surface 2211 of the slider 22 is electrically connected to the n-electrode layer 40a of the laser diode 40 through the back surface electrode 4100 and the first and second unit electrodes 450 and 451. The back surface electrode 4100 bonded with the first unit electrode 450 functions as an electrode for supplying power to the light source provided on the slider 22. When a predetermined voltage is applied between the n-electrode layer 40a and a p-electrode layer 40i of the laser diode 40 through the terminal electrodes 410 and 411 in the thermally-assisted magnetic recording head 21 completed by joining the light source unit 23 to the slider 22, the laser diode 40 oscillates and laser light is emitted from the light-emission center 4000.

The laser diode 40 is bonded onto the unit substrate 230 in such a manner that the distance $D_{REC}$ (FIG. 4) between the light-emitting surface 400 of the laser diode 40 and the surface of the first unit electrode 450 provided on the joining surface 230 in the direction perpendicular to the surface (in X-axis direction) is 0 or more, and 5 μm or less. When the light source unit 23 on which the laser diode 40 is mounted is bonded to the slider 22, the locations of the light source unit 23 and the slider 22 are determined so that laser light emitted from the light-emission center 4000 in the light-emitting surface 400 of the laser diode 40 is incident exactly at the light-receiving end surface 430 of the spot-size converter 43 provided in the head element 221. The bonding can be accomplished by joining the first unit electrode 450 of the light source unit 23 with the back surface electrode 4100 of the slider 22 by Au—Au ultrasonic joining, as will be described later. Alternatively, the light source unit 23 and the slider 22 can be joined by soldering the first unit electrode 450 to the back-surface electrode 4100 with one of lead-free solders such as Au—Sn alloy or by bonding them to each other with a conductive adhesive resin.

As also shown in FIG. 3, the slider substrate 220 is, for example, a so-called Femto slider having a thickness (in X-axis direction) $T_{SL}$ of 230 μm, a width $W_{SL}$ of 700 μm in the track width direction (Y-axis direction), and a length $L_{SL}$ (in Z-axis direction) of 850 μm. The Femto slider is commonly used as the substrate of a thin-film magnetic head capable of achieving a high recording density and is the smallest in standardized size among the currently used sliders. The back surface 2201 of the slider substrate 210 in this case has an area of 850 μm ($L_{SL}$)×700 μm ($W_{SL}$). The area contains the region in which the back-surface electrode 4100 is to be formed and the light source unit 23 is to be mounted and the region to be bonded to the flexure 201 (FIG. 2).

On the other hand, the unit substrate 230 is somewhat smaller than the slider substrate 220. In particular, the width $W_{UN}$ of the unit substrate 230 in the track width direction (Y-axis direction) is preferably smaller than the width $W_{SL}$ of the slider substrate 220, greater than or equal to the width $W_{LA}$ of the laser diode 40 in the track width direction (Y-axis direction), and less than or equal to 1.5 times the width $W_{LA}$. Since the light source unit 23 according to the present invention includes the first and second unit electrodes 450 and 451 described above, a terminal electrode for the laser diode 40 does not need to be provided on the source-installation surface 2302. Accordingly, the source-installation surface 2302 needs only an area that faces the entire n-electrode layer 40a of the laser diode 40. Even taking into consideration the provision of the area of a heat dissipation surface for the unit substrate 230 to function as a heatsink receiving and dissipating heat generated during light emitting operation by the laser diode 40, and taking into consideration the provision of a sufficient width $W_{UN}$ of the unit substrate 230 in view of the workability during bonding of the light source unit 23 onto the slider 22, the width $W_{UN}$ of the unit substrate 230 can be reduced to less than or equal to 1.5 times the width $W_{LA}$ of the laser diode 40. In order for the unit substrate 230 to effectively function as the heatsink, the laser diode 40 needs to be installed in such a manner that the laser diode 40 does not extend off the source-installation surface 2302. Accordingly, the thickness $T_{UN}$ (in X-axis direction) of the unit substrate 230 is preferably greater than or equal to the length $L_{LA}$ of the laser diode 40 in X-axis direction.

Considering the requirements described above, the unit substrate 230 may have a thickness $T_{UN}$ (in X-axis direction) of 320 μm, a width $W_{UN}$ in the track width direction (in Y-axis direction) of 300 μm, and a length $L_{UN}$ (in Z-axis direction) of 250 μm, for example, if the laser diode 40 to be used has a length $L_{LA}$ of 300 μm and a width $W_{LA}$ of 200 μm, for example. As seen from the above, the light source unit 23 according to the present invention can be adequately reduced in size to reduce the weight. The reduction of the weight maintains and enhances the flying performance and impact resistance of the head 21 in operation which has the light source unit 23 mounted on the slider 22 and is attached to the flexure 203 (FIG. 2).

Referring again to FIG. 3, the thermally-assisted magnetic recording head 21 has the structure in which the slider 22 and the light source unit 23 are interconnected as described above. Thus, the slider 22 and the light source unit 23 can be separately fabricated and then combined together to fabricate the head 21. Consequently, the production yield of the entire heads is about the same as the production yield of the sliders 22 if performance evaluation of the light source units 23 is performed prior to the fabrication of the heads and only good light source units 23 are used for the fabrication of the heads. Thus, the reduction of production yield of the entire heads due to the rejection rate of the laser diodes 40 can be avoided. Furthermore, since the light source unit 23 is attached to the back surface 2201 of the slider 22 which is opposite to the ABS 2200 of the slider 22, the laser diode 40 can be always disposed in a location far from the ABS 2200. As a result, direct mechanical impact on the laser diode 40 in operation can be avoided. Moreover, since the ABS 2200 of the slider 22 is perpendicular to the element-integration surface 2202, the slider 22 has a high affinity for conventional thin-film magnetic head fabrication processes. Since an optical part that requires a considerably high accuracy such as an optical pickup lens or an optical part that requires a special structure for connection such as an optical fiber do not need to be provided in the thermally-assisted magnetic recording head 21, the number of man-hours and thus costs can be reduced.

Figure 4:
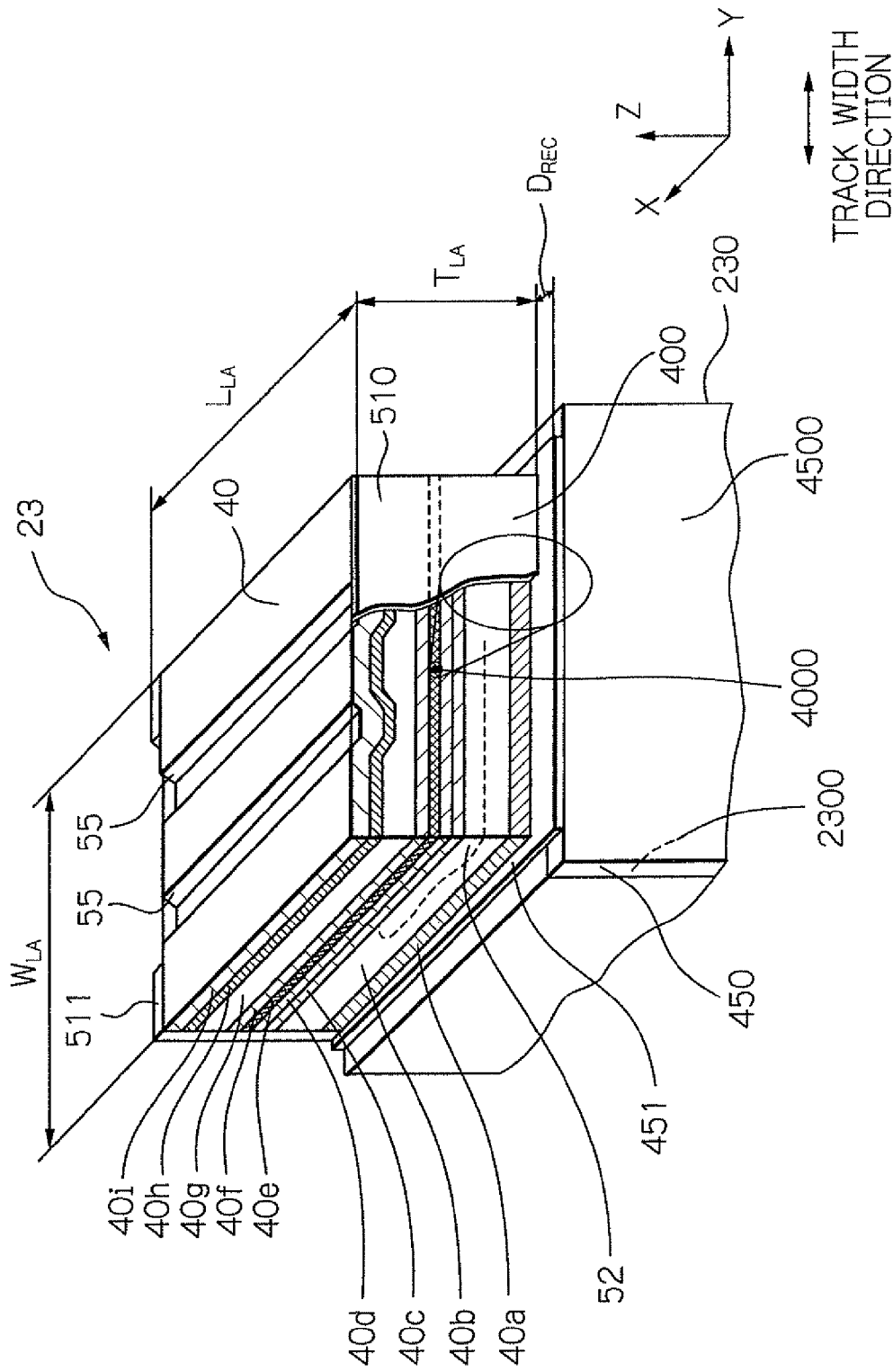
FIG. 4 shows a perspective view illustrating the structure of the laser diode and the state of joining the laser diode to the unit substrate.

FIG. 4 shows a perspective view illustrating the structure of the laser diode 40 and the state of joining the laser diode 40 to the unit substrate 230.

According to FIG. 4, the laser diode 40 is, in the present embodiment, of edge-emitting type. As the laser diode 40, InP base, GaAs base or GaN base diodes can be utilized, which are usually used for communication, optical disk storage, or material analysis. The wavelength $\lambda_L$ of the emitted laser light may be, for example, in the range of approximately 375 nm to 1.7 μm. For example, a laser diode of InGaAsP/InP quaternary mixed crystal can be used, in which possible wavelength region is set to be from 1.2 to 1.67 μm. Here, the laser diode 40 shown in FIG. 4 has a multilayered structure in which sequentially stacked from the unit substrate 230 side is: an n-electrode layer 40a having a surface contact and bonded with the second unit electrode 451; an n-GaAs substrate 40b; an n-InGaAlP clad layer 40c; the first InGaAlP guide layer 40d; an active layer 40e formed of multiquantum well (InGaP/InGaAlP) or the like; the second InGaAlP guide layer 40f; an p-InGaAlP clad layer 40g; a p-electrode base layer 40h; and a p-electrode layer 40i. The upper surface of the p-electrode layer 40i, which is equivalent to the upper surface of the laser diode 40, has grooves 55 extending in X-axis direction and corresponding to the ridge structure of laser diode. The ridge structure is formed of concavity and convexity that exist on the p-electrode layer side and ranges over the clad layer, and is provided for confining the laser light and concentrating it on the light-emission center. Here, the n-electrode layer 40a and the p-electrode layer 40i may be formed of, for example, gold (Au) or Au alloy with thickness of approximately 5 μm.

As described above, the laser diode 40 has a structure in which a multilayer including an active layer 40e is sandwiched between the n-electrode layer 40a and the p-electrode layer 40i. Here, the n-electrode layer 40a is located on the side opposite to the ridge structure and the active layer 40e is located closer to the p-electrode layer 40i than the n-electrode layer 40a. Accordingly, the light-emission center 4000 is located farther from the joining surface 2300 of the unit substrate 230 in Z-axis direction when the n-electrode layer 40a is bonded onto the unit substrate 230 as described above than when the p-electrode layer 40i is bonded onto the unit substrate 230. Consequently, alignment of the laser diode 40 with the unit substrate 230 can be performed by means of a positioning jig having a flat surface when the laser diode 40 is bonded onto the unit substrate 230, as will be described later. Specifically, the position of the laser diode 40 relative to the unit substrate 230 can be determined by butting a portion of the light-emitting surface 400 of the laser diode 40 on the unit substrate 230 side that does not include the light-emission center 4000 and at least a portion of the surface of the first unit electrode 450 against the flat surface of the positioning jig. In doing so, at least the light-emission center 4000 is prevented from being butted against the flat surface of the positioning jig. Therefore degradation of the light emission property of the laser diode 40 due to excessive mechanical stress and damage is avoided.

On the front and rear cleaved surfaces of the multilayered structure of the laser diode 40, respectively formed are reflective layers 510 and 511 for exciting the oscillation by total reflection. The outer surface of the reflective layer 510 on the joining surface 2300 side is a light-emission surface 400. Further, in the reflective layer 510, there is an opening (not shown in the figure) in the position of the active layer 40e including the light-emission center 4000. Furthermore, the laser diode 40 has a width $W_{LA}$ of, for example, approximately 150 to 250 μm. The length $L_{LA}$ of the laser diode 40 corresponds approximately to a cavity length that is the distance between the reflective layers 510 and 511, and is, for example, 300 μm. The length $L_{LA}$ is preferably 300 μm or more in order to obtain a sufficient high output. Further, the height $T_{LA}$ of the laser diode 40 is, for example, approximately 60 to 200 μm.

An electric source provided within the magnetic disk apparatus can be used for driving the laser diode 40. In fact, the magnetic disk drive apparatus usually has an electric source with applying voltage of, for example, approximately 2 to 5V, which is sufficient for the laser oscillation. Even in the case that the amount of electric power consumption of the laser diode 40 is, for example, in the vicinity of one hundred mW, the amount can be covered sufficiently by the electric source provided within the magnetic disk apparatus.

Referring again to FIG. 4, the n-electrode layer 40a of the laser diode 40 and the second unit electrode 451 of the unit substrate 230 can be bonded to each other by soldering using one of lead-free solders such as Au—Sn alloy 52, as will be described later. Alternatively, they can be bonded together by using a conductive adhesive resin. Here, preferably the laser diode 40 is bonded onto the unit substrate 230 in such a way that the distance $D_{REC}$ between the light-emitting surface 400 of the laser diode 40 and the surface 4500 of the first unit electrode 450 provided on the joining surface 2300 in the direction perpendicular to the surface 4500 (X-axis direction) is 0 or more, and 5 μm or less. Since the distance $D_{REC}$ is greater than or equal to 0, the light-emitting surface 400 of the laser diode 40 does not protrude from the light source unit 23. Consequently, the laser diode 40 is prevented from being subjected to excessive mechanical stress and damage during bonding. Furthermore, since the direction D is less than or equal to 5 μm, the distance between the light-emission center 4000 and the light-receiving end surface 430 of the optical system 31 (FIG. 3) disposed on the back surface 2201 of the slider 22 is sufficiently small and therefore a high light use efficiency can be provided.

Figure 5:
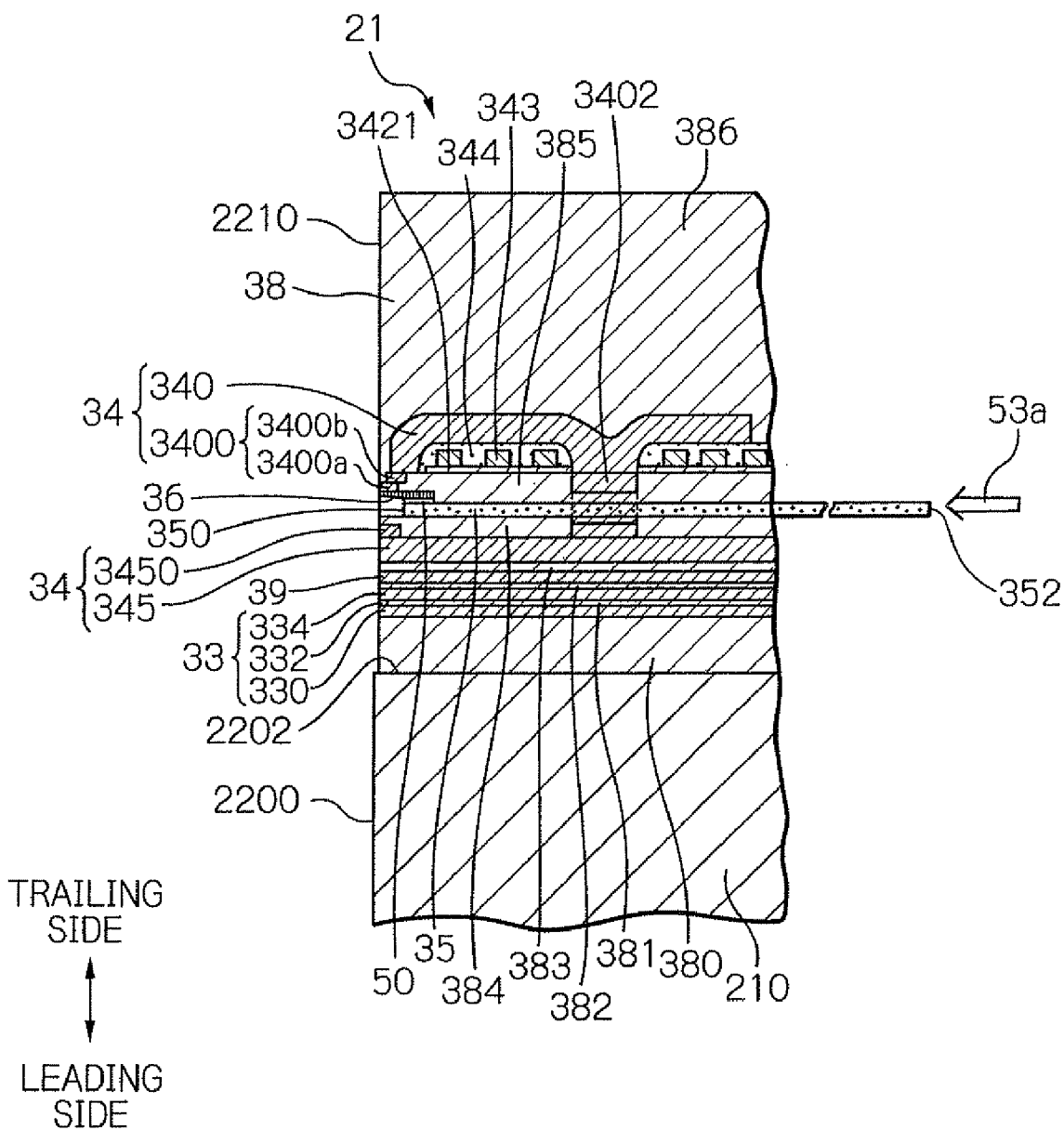
FIG. 5 shows a cross-sectional view taken by plane A in FIG. 3, schematically illustrating the configuration of the head element and its vicinity in the thermally-assisted magnetic recording head.

FIG. 5 shows a cross-sectional view taken by plane A in FIG. 3, schematically illustrating the configuration of the head element 32 and its vicinity in the thermally-assisted magnetic recording head 21.

As shown in FIG. 5, the MR element 33 is formed on a base layer 380 that is formed of an insulating material such as $Al_2O_3$ (alumina), $SiO_2$ and stacked on the element-integration surface 2102. The MR element 33 includes: an MR multilayer 332; and a lower shield layer 330 and an upper shield layer 334 which sandwich the MR multilayer 332 and an insulating layer 381 therebetween. The upper and lower shield layers 334 and 330 prevent the MR multilayer 332 from receiving external magnetic field as a noise. The upper and lower shield layers 334 and 330 are formed of a soft-magnetic material such as NiFe (Permalloy) and have a thickness of, for example, approximately 0.5 to 3 μm. The MR multilayer 332 is a magneto-sensitive part for detecting signal magnetic field by utilizing MR effect. The MR multilayer 332 may be, for example: a current-in-plane giant magnetoresistive (CIP-GMR) multilayer that utilizes CIP-GMR effect; a current-perpendicular-to-plane giant magnetoresistive (CPP-GMR) multilayer that utilizes CPP-GMR effect; or a tunnel magnetoresistive (TMR) multilayer that utilizes TMR effect. The MR multilayer 332 that utilizes any MR effect described above can detect signal magnetic field from the magnetic disk with high sensitivity. In the case that the MR multilayer 332 is a CPP-GMR multilayer or a TMR multilayer, the upper and lower shield layers 334 and 330 act as electrodes. Whereas, in the case that the MR multilayer 332 is a CIP-GMR multilayer, insulating layers are provided between the MR multilayer 332 and respective upper and lower shield layers 334 and 330; further, formed are MR lead layers that are electrically connected to the MR multilayer 332.

Referring also to FIG. 5, the electromagnetic transducer 34 is designed for perpendicular magnetic recording, and includes an upper yoke layer 340, a main magnetic pole 3400, a write coil layer 343, a coil-insulating layer 344, a lower yoke layer 345, and a lower shield 3450.

The upper yoke layer 340 is formed so as to cover the coil-insulating layer 344, and the main magnetic pole 3400 is formed on an insulating layer 385 made of an insulating material such as $Al_2O_3$ (alumina). These upper yoke layer 340 and main magnetic pole 3400 are magnetically connected with each other, and acts as a magnetic path for converging and guiding magnetic flux toward the magnetic recording layer (perpendicular magnetization layer) of the magnetic disk 10 (FIG. 1), the magnetic flux being excited by write current flowing through the write coil layer 343. The main magnetic pole 3400 includes: a first main pole portion 3400a reaching the head end surface 2210 and having a small width $W_P$ (FIG. 6) in the track width direction; and a second main pole portion 3400b located on the first main pole portion 3400a and at the rear (+X side) of the portion 3400a. The first main pole portion 3400a has an end surface 3400e (FIG. 6) with a shape of, for example, a rectangle, a square or a trapezoid on the head end surface 2210. Here, the above-described width $W_P$ is the length of an edge in the track width direction (Y-axis direction) of the end surface 3400e, and defines the width of write field distribution in the track width direction (Y-axis direction). The width $W_P$ can be set to be, for example, 0.05 to 0.5 μm. The main magnetic pole 3400 is preferably formed of a soft-magnetic material with a saturation magnetic flux density higher than that of the upper yoke layer 340, which is, for example, an iron alloy containing Fe as a main component, such as FeNi, FeCo, FeCoNi, FeN or FeZrN. The thickness of the first main pole portion 3400a is, for example, in the range of approximately 0.1 to 0.8 μm.

The write coil layer 343 is formed on an insulating layer 385 made of an insulating material such as $Al_2O_3$ (alumina), in such a way as to pass through in one turn at least between the lower yoke layer 345 and the upper yoke layer 340, and has a spiral structure with a back contact portion 3402 as a center. The write coil layer 343 is formed of a conductive material such as Cu (copper). The write coil layer 343 is covered with a coil-insulating layer 344 that is formed of an insulating material such as a heat-cured photoresist and electrically isolates the write coil layer 343 from the upper yoke layer 340. The write coil layer 343 has a monolayer structure in the present embodiment; however, may have a two or more layered structure or a helical coil shape. Further, the number of turns of the write coil layer 343 is not limited to that shown in FIG. 5, and may be, for example, in the range from two to seven.

The back contact portion 3402 has a though-hole extending in X-axis direction, and the waveguide 35 and insulating layers that covers the waveguide 35 pass through the though-hole. In the though-hole, the waveguide 35 is away at a predetermined distance of, for example, at least 1 μm from the inner wall of the back contact portion 3402. The distance prevents the absorption of the waveguide light by the back contact portion 3402.

The lower yoke layer 345 is formed on an insulating layer 383 made of an insulating material such as $Al_2O_3$ (alumina), and acts as a magnetic path for the magnetic flux returning from a soft-magnetic under layer that is provided under the magnetic recording layer (perpendicular magnetization layer) of the magnetic disk 10. The lower yoke layer 345 is formed of a soft-magnetic material, and its thickness is, for example, approximately 0.5 to 5 μm. Further, the lower shield 3450 is a part of the magnetic path, being connected with the lower yoke layer 345 and reaching the head end surface 2210. The lower shield 3450 is opposed to the main magnetic pole 3400 through the surface plasmon generator 36, and acts for receiving the magnetic flux spreading from the main magnetic pole 3400. The lower shield 3450 has a width in the track width direction greatly larger than that of the main magnetic pole 3400. This lower shield 3450 causes the magnetic field gradient between the end portion of the lower shield 3450 and the first main pole portion 3400a to become steeper. As a result, jitter of signal output becomes smaller, and therefore, error rates during read operations can be reduced. The lower shield 3450 is preferably formed of a material with high saturation magnetic flux density such as NiFe (Permalloy) or an iron alloy as the main magnetic pole 3400 is formed of.

Referring also to FIG. 5, laser light 53a, the spot size of which the spot-size converter 43 changes (reduces), enters the waveguide 35 from the light-receiving end surface 352, and propagates through the waveguide 35. The waveguide 35 extends from the light-receiving end surface 352 to the end surface 350 on the head end surface 2210 side through the through-hole that is provided in the back contact portion 3402 and extends in X-axis direction. Furthermore, the surface plasmon generator 36 is a near-field optical device that transforms the laser light (waveguide light) propagating through the waveguide 35 into near-field light. A part on the head end surface 2210 side of the waveguide 35 and the surface plasmon generator 36 are provided between the lower shield 3450 (lower yoke layer 345) and the main magnetic pole 3400 (upper yoke layer 340). Further, a portion of the upper surface (side surface) of the waveguide 35 on the head end surface 2210 side is opposed to a portion of the lower surface (including a propagation edge 360 (FIG. 6)) of the surface plasmon antenna 36 with a predetermined distance. The sandwiched portion between these portions constitutes a buffering portion 50 having a refractive index lower than that of the waveguide 35. The buffering portion 50 acts for coupling the laser light (waveguide light) that propagates through the waveguide 35 with the surface plasmon generator 36 in a surface plasmon mode. A detailed explanation of the waveguide 35, the buffering portion 50 and the surface plasmon generator 36 will be given later with reference to FIG. 6.

Further, also as shown in FIG. 5, an inter-element shield layer 39 is preferably provided between the MR element 33 and the electromagnetic transducer 34 (lower yoke layer 345), sandwiched by the insulating layers 382 and 383. The inter-element shield layer 39 plays a role for shielding the MR element 33 from the magnetic field generated from the electromagnetic transducer 34, and may be formed of a soft-magnetic material. Here, the above-described insulating layers 381, 382, 383, 384, 385 and 386 constitute the overcoat layer 38.

Figure 6:
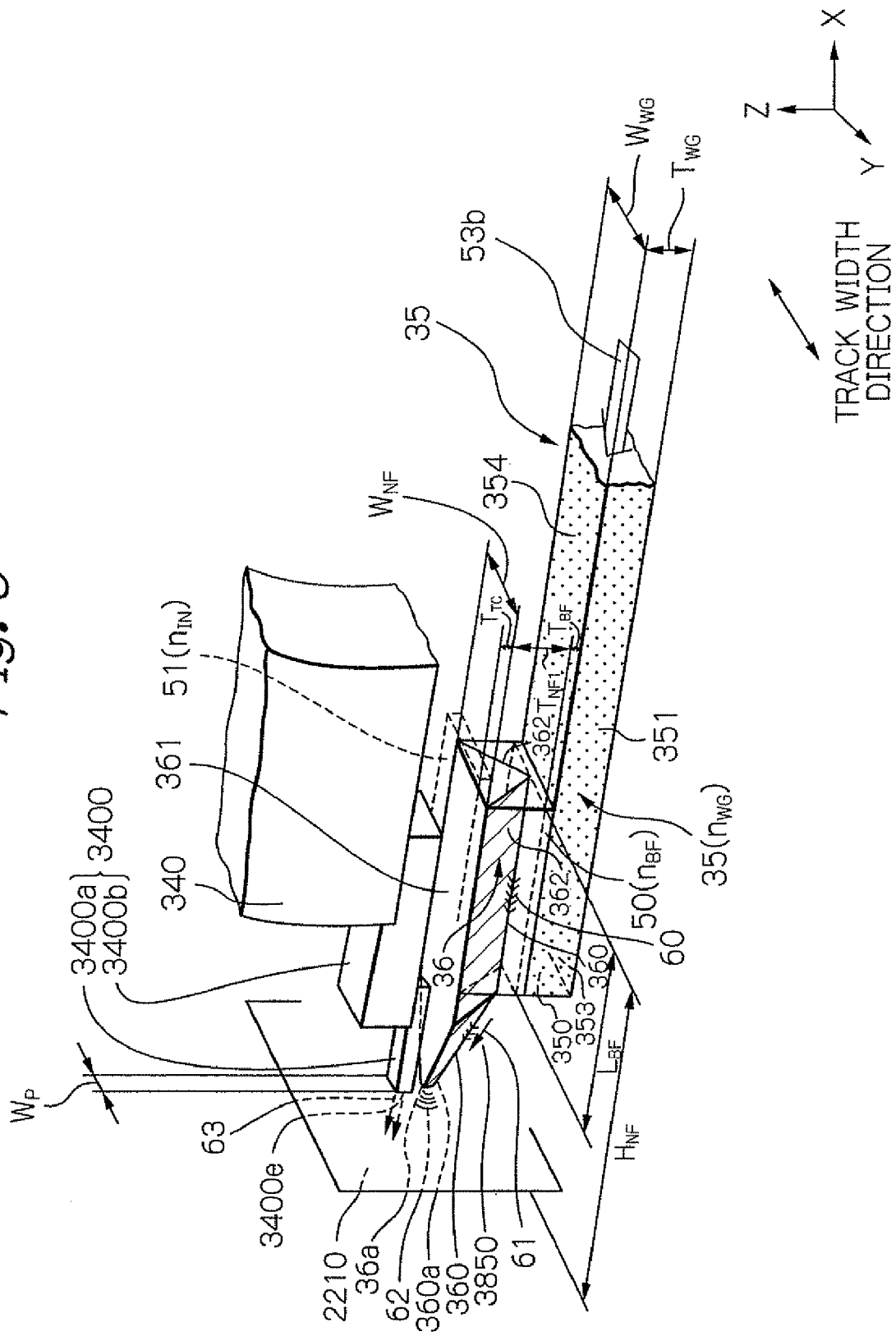
FIG. 6 shows a perspective view schematically illustrating the configuration of the waveguide, the surface plasmon generator and the main magnetic pole.

FIG. 6 shows a perspective view schematically illustrating the configuration of the waveguide 35, the surface plasmon generator 36 and the main magnetic pole 3400. In the figure, the head end surface 2210 is positioned at the left side, the surface 2210 including positions where write field and near-field light are emitted toward the magnetic recording medium.

As shown in FIG. 6, the configuration includes the waveguide 35 for propagating laser light (waveguide light) 53b used for generating near-field light toward the end surface 350, and the surface plasmon generator 36 that has a propagation edge 360 as an edge on which surface plasmon excited by the laser light (waveguide light) 53b propagates. The surface plasmon generator 36 further includes a near-field light generating end surface 36a that reaches the head end surface 2210 and is a destination for the excited surface plasmon. Further, a buffering portion 50 is a portion sandwiched between a portion of the side surface 354 of the waveguide 35 and a portion of the lower surface 362 including the propagation edge 360 of the surface plasmon generator 36. That is, a portion of the propagation edge 360 is covered with the buffering portion 50. The buffering portion 50 acts for coupling the waveguide light 53b with the surface plasmon generator 36 in a surface plasmon mode. Further, the propagation edge 360 plays a role of propagating the surface plasmon excited by the waveguide light 53b to the near-field light generating end surface 36a. Here, side surfaces of the waveguide 35 are defined as, out of end surfaces surrounding the waveguide 35, end surfaces other than the end surface 350 on the head end surface 2210 side and the light-receiving end surface 352 on the opposite side. These side surfaces serve as surfaces on which the propagating waveguide light 53b can be totally reflected in the waveguide 35 that corresponds to a core. In the present embodiment, the side surface 354 of the waveguide 35, a portion of which is in surface contact with the buffering potion 50, is the upper surface of the waveguide 35. And, the buffering portion 50 may be a portion of the overcoat layer 38 (FIG. 2), or may be provided as a new layer other than the overcoat layer 38.

Specifically, the waveguide light 53b, which has advanced to near the buffering portion 50, is involved with the optical configuration including the waveguide 35 with a refractive index $n_{WG}$, the buffering portion 50 with a refractive index $n_{BF}$ and the surface plasmon generator 36 made of a metal, and induces a surface plasmon mode on the propagation edge 360 of the surface plasmon generator 36. That is, the waveguide light couples with the surface plasmon generator 36 in a surface plasmon mode. The induction of the surface plasmon mode becomes possible by setting the refractive index $n_{BF}$ of the buffering portion 50 to be smaller than the index $n_{WG}$ of the waveguide 35 ($n_{BF} < n_{WG}$). Actually, evanescent light is excited within the buffering portion 50 under an optical boundary condition between the waveguide 35 as a core and the buffering portion 50. Then, the evanescent light couples with the fluctuation of electric charge excited on the metal surface (propagation edge 360) of the surface plasmon generator 36, and induces the surface plasmon mode, thereby there is excited surface plasmon 60. To be exact, there excited is surface plasmon polariton in this system because surface plasmon as elementary excitation is coupled with an electromagnetic wave. However, the surface plasmon polariton will be hereinafter referred to as surface plasmon for short. The propagation edge 360 is located closest to the waveguide 35 on the inclined lower surface 362 of the surface plasmon generator 36, and is just an edge where electric field tends to converge; thus surface plasmon can easily be excited on the edge 360.

In the light source and optical system as shown in FIGS. 3, 5 and 6, the laser light emitted from the light-emission surface 400 of the laser diode 40 preferably has TM-mode polarization in which the oscillation direction of electric field of the laser light is along Z-axis. Further, the waveguide light 53b accordingly have a linear polarization in which the oscillation direction of electric field of the laser light is Z-axis direction, that is, perpendicular to the layer surface of the waveguide 35. Setting the polarization enables the waveguide light 53b propagating through the waveguide 35 to be coupled with the surface plasmon generator 36 in a surface plasmon mode.

Further, as shown in FIG. 6, the near-field light generating end surface 36a of the surface plasmon generator 36 is located close to the end surface 3400e of the main magnetic pole 3400 reaching the head end surface 2210, and is positioned on the leading side (−Z side) of the end surface 3400e and on the trailing side (+Z side) of the lower shield 3450. The distance between the near-field light generating end surface 36a and the end surface 3400e is preferably set to be a sufficiently small value of, for example, 100 nm or less. In the thermally-assisted magnetic recording, the near-field light generating end surface 36a functions as a main heating action part, and the end surface 3400e functions as a writing action part. Therefore, by setting the distance as described above, write field with a sufficiently large gradient can be applied to a portion of the magnetic recording layer of the magnetic disk, the portion having been sufficiently heated.

The propagation edge 360 extends to the near-field light generating end surface 36a. Further, in the present embodiment, a portion of the propagation edge 360 on the end surface 36a side (on the head end surface 2210 side) has a shape of straight line or curved line extending so as to become closer to the end surface 361 of the surface plasmon generator 36 as going toward the near-field light generating end surface 36a, the end surface 361 being opposite to the propagation edge 360. Surface plasmon 60 excited on the propagation edge 360 propagates on the propagation edge 360 along the direction shown by arrows 61. The propagation edge 360 is made rounded to prevent surface plasmon from running off from the edge 360, and thus to prevent the degradation of light use efficiency.

The surface plasmon generator 36, in the present embodiment, tapers in the height direction (Z-axis direction) near the head end surface 2210 toward the near-field light generating end surface 36a. Further, the surface plasmon generator 36 has, in the present embodiment, a cross-section taken by YZ plane with a triangular shape, and the near-field light generating end surface 36a especially has an isosceles triangle shape in which one apex on the leading side (−Z side) is the end of the propagation edge 360. Thus, surface plasmon 60 propagating on the propagation edge 360 reaches the near-field light generating end surface 36a having an apex 360a as a destination of the edge 360. As a result, the surface plasmon 60, namely, electric field converges in the near-field light generating end surface 36a. Thereby near-field light 62 is emitted from the end surface 36a toward the magnetic recording layer of the magnetic disk 10, and reaches the surface of the magnetic disk 10 to heat a portion of the magnetic recording layer of the disk 10. This heating reduces the anisotropic magnetic field (coercive force) of the portion to a value with which write operation can be performed. Immediately after the heating, write field 63 generated from the main magnetic pole 3400 is applied to the portion to perform write operation. Thus, the thermally-assisted magnetic recording can be accomplished.

Furthermore, the length $L_{BF}$ of the whole buffering portion 50, that is, the portion through which the waveguide 35 and the surface plasmon generator 36 are coupled with each other in a surface plasmon mode, is preferably larger than the wavelength $\lambda_L$ of the laser light. In this preferable case, the coupling portion has an area markedly larger than a so-called "focal region" in the case that, for example, laser light is converged on a buffering portion and a surface plasmon generator and coupled in a surface plasmon mode. Therefore, a configuration quite different from the system including such "focal region" can be realized in the present invention; thus, very stable coupling in the surface plasmon mode can be achieved. The induction of surface plasmon mode is disclosed in, for example, Michael Hochberg, Tom Baehr-Jones, Chris Walker & Axel Scherer, "Integrated Plasmon and dielectric waveguides", OPTICS EXPRESS Vol. 12, No. 22, pp 5481-5486 (2004), U.S. Pat. No. 7,330,404 B2, and U.S. Pat. No. 7,454,095 B2.

Referring also to FIG. 6, the waveguide 35 and the buffering portion 50 are provided on −Z side (on the leading side), that is, on the opposite side to the main magnetic pole 3400 in relation to the surface plasmon generator 36. As a result, the propagation edge 360 is also positioned on the opposite side to the main magnetic pole 3400 within the surface plasmon generator 36. By applying such a configuration, even when a distance between the end surface 3400e generating write field of the main magnetic pole 3400 and the end surface 36a emitting near-field light is sufficiently small, preferably 100 nm or less, the waveguide 35 can be separated sufficiently apart from the main magnetic pole 3400. As a result, there can be avoided a situation in which a part of the waveguide light is absorbed into the main magnetic pole 3400 made of metal and the amount of light to be converted into near-field light is reduced.

Further, in the present embodiment, the waveguide 35 has a cross-section taken by YZ-plane of a rectangular or trapezoidal shape. The width $W_{WG}$ in the track width direction (Y-axis direction) of a portion of the waveguide 35 near the end surface 350 on the head end surface 2210 side may be, for example, in the range approximately from 0.3 to 0.7 µm. Further, the thickness $T_{WG}$ (in Z-axis direction) of the waveguide 35 may be, for example, in the range approximately from 0.3 to 0.7 µm.

Further, the side surfaces of the waveguide 35: the upper surface 354, the lower surface 353, and both the side surfaces 351 in the track width direction (Y-axis direction) have a surface contact with the overcoat layer 38 (FIG. 3), that is, the insulating layers 384 and 385 (FIG. 5), except a portion having a surface contact with the buffering portion 50. Here, the waveguide 35 is formed of a material with a refractive index $n_{WG}$ higher than the refractive index $n_{OC}$ of the constituent material of the overcoat layer 38, made by using, for example, a sputtering method. For example, in the case that the wavelength $\lambda_L$ of the laser light is 600 nm and the overcoat layer 38 is formed of $Al_2O_3$ (n=1.63), the waveguide 35 can be formed of, for example, $SiO_XN_Y$ (n=1.7-1.85), $Ta_2O_5$ (n=2.16), $Nb_2O_5$ (n=2.33), TiO (n=2.3-2.55) or $TiO_2$ (n=2.3-2.55). The just-described material structure of the waveguide 35 enables the propagation loss of laser light 53b to be reduced due to the excellent optical characteristics of the constituent material. Further, the waveguide 35 that acts as a core can provide the total reflection in all the side surfaces of the waveguide 35 due to the existence of the overcoat layer 38 acting as a clad. As a result, more amount of laser light 53b can reach the position of the buffering portion 50, which Improves the propagation efficiency of the waveguide 35.

The surface plasmon generator 36 is preferably formed of a conductive material of, for example, a metal such as Ag, Au, pd, Pt, Rh, Ir, Ru, Cu or Al, or an alloy made of at least two of these elements, especially an alloy with Ag as a main component. Further, the surface plasmon generator 36 can have a width $W_{NF}$ in the track width direction (Y-axis direction) of the upper surface 361, the width $W_{NF}$ being sufficiently smaller than the wavelength of the laser light 53b, and being in the range of, for example, approximately 10 to 100 nm. And the surface plasmon generator 36 can have a thickness $T_{NF1}$ (in Z-axis direction) sufficiently smaller than the wavelength of the laser light 53b, the thickness $T_{NF1}$ being in the range of, for example, approximately 10 to 100 nm. Further, the length (height) $H_{NF}$ (in X-axis direction) can be set to be in the range of, for example, approximately 0.8 to 6.0 µm.

The buffering portion 50 is formed of a dielectric material having a refractive index $n_{BF}$ lower than the refractive index $n_{WG}$ of the waveguide 35. For example, when the wavelength $\lambda_L$ of the laser light is 600 nm and the waveguide 35 is formed of $Ta_2O_5$ (n=2.16), the buffering portion 50 can be formed of $SiO_2$ (n=1.46) or $Al_2O_3$ (n=1.63). Further, the length $L_{BF}$ (in X-axis direction) of the buffering portion 50, namely, the length of a portion sandwiched between the side surface 354 of the waveguide 35 and the propagation edge 360, is preferably in the range of 0.5 to 5 µm, and is preferably larger than the wavelength $\lambda_L$ of the laser light 53b. Further, the thickness $T_{BF}$ (in Z-axis direction) of the buffering portion 50 is preferably in the range of 10 to 200 nm.

Also as shown in FIG. 6, a thermal conduction layer 51 is preferably provided on the head end surface 2210 side between the surface plasmon generator 36 and the first main pole portion 3400a. The thermal conduction layer 51 is formed of, for example, an insulating material such as AlN, SiC or DLC, which has higher thermal conductivity compared with that of the overcoat layer 38. Providing the thermal conduction layer 51 allows a part of the heat generated when the surface plasmon generator 36 emits near-field light to get away to the main magnetic pole 3400 through the thermal conduction layer 51. That is, the main magnetic pole 3400 can be utilized as a heatsink. The thickness $T_{TC}$ of the thermal conduction layer 51 corresponds to a distance on the head end surface 2210 between the near-field light generating end surface 36a and the end surface 3400e of the main magnetic pole 3400, and is preferably set to be a sufficiently small value of 100 nm or less. Further, the refractive index $n_{IN}$ of the thermal conduction layer 51 is set equal to or lower than the refractive index $n_{BF}$ of the buffering portion 50 that covers the propagation edge 360 of the surface plasmon generator 36. This allows surface plasmon to propagate stably on the propagation edge 360.

The optical system that is provided in the head element part 221 and generates light for thermal assist is not limited to the above-described one. For example, as an alternative, the laser light generated from the laser diode 40 may be emitted directly from the end surface 350 of the waveguide 35 that reaches the head end surface 2210, instead of providing the surface plasmon generator 36 for generating near-field light. The emitted light could heat the magnetic recording layer of the magnetic disk 10 to perform thermal assist. As another alternative, a plasmon antenna made of a metal piece may be provided at the end surface 350 of the waveguide 35 that reaches the head end surface 2210. The plasmon antenna may be irradiated with the waveguide light propagating through the waveguide 35; thus near-field light could be emitted toward the magnetic disk 10.

Figure 7A:
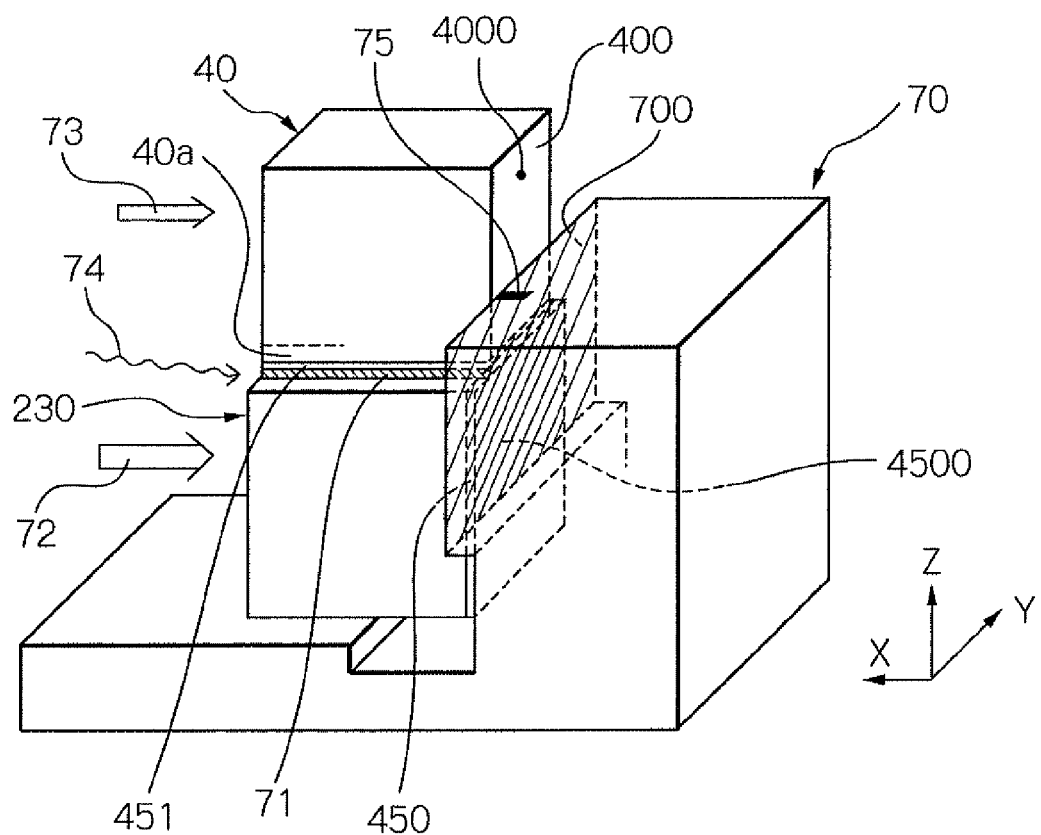
FIGS. 7a and 7b show perspective views schematically illustrating embodiments of method for manufacturing the light source unit.
Figure 7B:
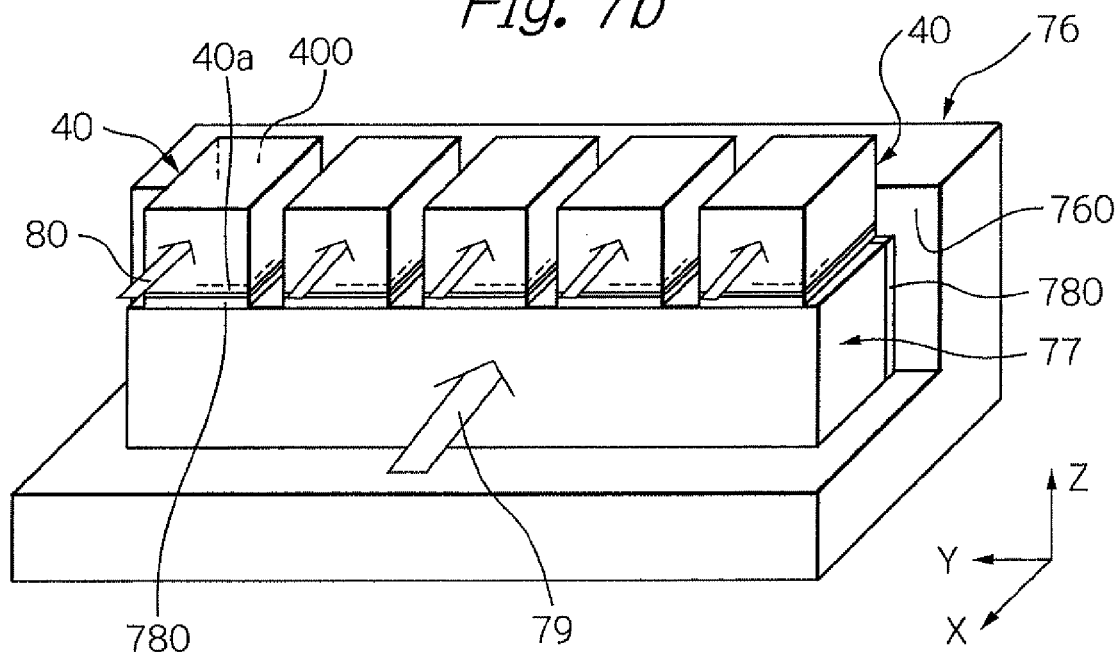

FIGS. 7a and 7b show perspective views schematically illustrating embodiments of method for manufacturing the light source unit 23.

According to the embodiment shown in FIG. 7a, a positioning jig 70 having a flat surface 700 is used for the fabrication of the light source unit 23 in which an edge-emitting laser diode 40 is bonded onto a unit substrate 230 on which first and second unit electrodes 450 and 451 have been formed. First, the unit substrate 230 on which the first and second unit electrodes 450 and 451 have been formed is placed on the positioning jig 70 with the end surface opposite to the second unit electrode 451 down. The unit substrate 230 is moved in the direction indicated by arrow 72 (in −X direction) until the surface 4500 of the first unit electrode 450 butts against the flat surface 700.

Then, the surface of the n-electrode layer 40a of the laser diode 40 is coated with a conductive UV curable resin 71 such as UV curable epoxy resin or UV curable acrylic resin to which a conductive filler is added. The surface of the unit electrode 451 on the unit substrate 230 may also be coated with the conductive UV curable resin 71 beforehand. Alternatively, only the surface of the unit electrode 451 may be coated with the conductive UV curable resin 71 beforehand. The laser diode 40 is then placed on the unit substrate 230 with the n-electrode layer 40a coated with the conductive UV curable resin 71 down so that the n-electrode layer 40a faces the second unit electrode 451.

Then, the laser diode 40 is moved in the direction indicated by arrow 73 (in −X direction) until the light-emitting surface 400 butts against the flat surface 700. This determines the positions of the laser diode 40 and the unit substrate 230 relative to each other in X-axis direction. In this case, the distance $D_{REC}$ (FIG. 4) between the light-emitting surface 400 and the surface 4500 of the first unit electrode 450 in X-axis direction is set to zero. Then, the laser diode 40 is moved in Y-axis direction while the surface 4500 of the first unit electrode 450 and the light-emitting surface 400 are being butted against the flat surface 700, thereby aligning the laser diode 40 with a predetermined position in Y-axis direction. As a result, the positions of the laser diode 40 and the unit substrate 230 relative to each other in Y-axis direction (the track width direction) are determined.

Lastly, the conductive UV curable resin 71 sandwiched between the laser diode 40 and the unit substrate 230 aligned with each other is irradiated with UV light 74 to cure the conductive UV curable resin 71 to bond the laser diode 40 and the unit substrate 230 to each other. With this, the light source unit 23 is completed.

In an alternative, solder such as Au—Sn alloy may be used for bonding the laser diode 40 and the unit substrate 230 instead of the conductive UV curable resin 71. In that case, an Au—Sn alloy film is evaporated on the surface of the n-electrode layer 40a or the surface of the unit electrode 451 or the surfaces of both of these to a thickness in the range of approximately 0.7 to 1 μm, for example. Then, the laser diode 40 is placed on the unit electrode 451, the positioning jig 70 is used to position the laser diode 40 as described above, and then heating is performed with a hotplate or the like under a hot-air blower to approximately 200 to 300° C. to fix the laser diode 40 onto the unit substrate 230. If soldering with Au—Sn alloy is used in this way, the light source unit 23 will be heated to a high temperature on the order of 300° C., for example. However, since the light source unit 23 is fabricated separately from the slider 22, the head element in the slider 22 is not subject to adverse effect of the high temperature.

The bonding resin or solder does not flow into the light-emission center 4000 because the light-emission center 400 is sufficiently distant from the second unit electrode 451, which is the part to be bonded. This eliminates the need for special shaping of the edges of the unit substrate 230 for preventing such flow.

In the method for fabricating the light source unit 23 described above, a portion of the light-emitting surface 400 can be easily butted against the flat surface 700 while preventing the light-emission center 4000 from hitting the flat surface 700 because the positioning jig 70 is used and the n-electrode layer 40a of the laser diode 40 and the second unit electrode 451 are bonded to each other. Consequently, the positioning of the laser diode 40 and the unit substrate 230 relative to each other in X-axis direction can be accomplished with a high degree of accuracy without applying an excessive mechanical stress to the laser diode 40. Therefore, the light-emission center 4000 and the light-receiving end surface 352 of the optical system 31 (FIG. 3) can be disposed sufficiently close to each other in the completed thermally-assisted magnetic recording head 21. As a result, a sufficiently high light use efficiency is achieved.

Here, even if the distance $D_{REC}$ (FIG. 4) is set to zero, a problem such as damage to the laser diode 40, which would be caused by contact of the light-emitting surface 400 (the light-emission center 4000) with the slider 22, is avoided. In effect, there is the back surface electrode 4100 between the first unit electrode 450 and the back surface 2201 of the slider substrate 220 in the completed thermally-assisted magnetic recording head 21 as depicted in FIG. 3. Accordingly, the light-emission center 4000 and the light-receiving end surface 352 of the optical system 31 (FIG. 3) is at a distance equal to at least the thickness of the back surface electrode 4100 from each other. The thickness of the back surface electrode 4100 is controlled to approximately 1 to 5 μm, for example.

The positioning described above does not need any sophisticated image recognition technology or high-precision positioning mechanism. Consequently, the production does not require so expensive a facility or prolonged tact time for production. Therefore, the per-head-chip production cost can be kept sufficiently low.

Tolerances in relative positioning of the laser diode 40 and the unit substrate 230 in Y-axis direction (the track width direction) are far larger than tolerances in X-axis direction. This is because the mutual alignment of the optical axes of the laser diode 40 and the optical system 31 (FIG. 3) in Y-axis direction (the track width direction) only needs to be completed ultimately when the light source unit 23 is connected to the slider 22. Therefore, the positioning in Y-axis direction (the track width direction) can be performed, for example, by aligning an edge of the light-emitting surface 400 with a marker 75 provided on the positioning jig 70.

In another embodiment, laser diodes 40 may be mounted on a unit row bar 77 cut out from a wafer, for example, as shown in FIG. 7b. Here, the unit row bar 77 includes multiple first and second unit electrodes 780 and 781 arranged in a row, and will be cut into multiple unit substrates 230. A positioning jig 76 having a flat surface 760 is used in the fabrication method. First, a unit row bar 77 is placed on the positioning jig 76 with an end surface side down, the end surface being opposite to the surface on which second unit electrodes 781 are arranged in a row. The unit row bar 77 is moved in the direction indicated by arrow 79 (in −X direction) until the first unit electrodes 780 arranged in a row butt against the flat surface 760.

Then, a conductive UV curable resin or solder such as Au—Sn alloy described with respect to FIG. 7a is applied to the surfaces of an n-electrode layers 40a or the surfaces of the multiple second unit electrodes 781 or both of these surfaces. Then, the multiple laser diodes 40 are placed on the respective second unit electrodes 781 on the unit row bar 77 with the n-electrode layers 40 side down.

Then, the multiple laser diodes 40 are moved in the direction indicated by arrow 80 (in −X direction) until the light-emitting surfaces 400 butt against the flat surface 760. This determines the relative positions of the laser diodes 40 relative to the unit row bar 77 in X-axis direction. Again, the distance $D_{REC}$ (FIG. 4) between the light-emitting surface 400 and the surface of the first unit electrode 780 in X-axis direction is set to zero. Then the laser diodes 40 are moved in Y-axis direction while the surface of the first unit electrodes 750 and the light-emitting surface 400 are being butted against the flat surface 760, thereby aligning the laser diodes 40 with a predetermined position in Y-axis direction. As a result, the relative positions of the laser diodes 40 relative to the unit row bar 77 in Y-axis direction (the track width direction) are determined.

Then, the conductive UV curable resin that lies between the laser diodes 40 and the unit row bar 77 aligned with each other is irradiated with UV light to cure the resin, or the solder such as the Au—Sn alloy that lies between them is heated to join them together, thereby bonding the laser diodes 40 and the unit row bar 77 to each other. Then, the unit row bar 77 on which the multiple laser diodes 40 have been mounted is appropriately cut into multiple light source units 23 to complete the fabrication of the light source units 23. A screening inspection during the fabrication can be performed on the multiple laser diodes 40 mounted on the unit row bar 77. Specifically, first a performance evaluation of each of the mounted multiple laser diodes 40 is performed, and then the unit row bar 77 is cut into chips. The chips on which a laser diode 40 judged as satisfying predetermined performance criteria is mounted are selected as good light source units 23.

Figure 8A:
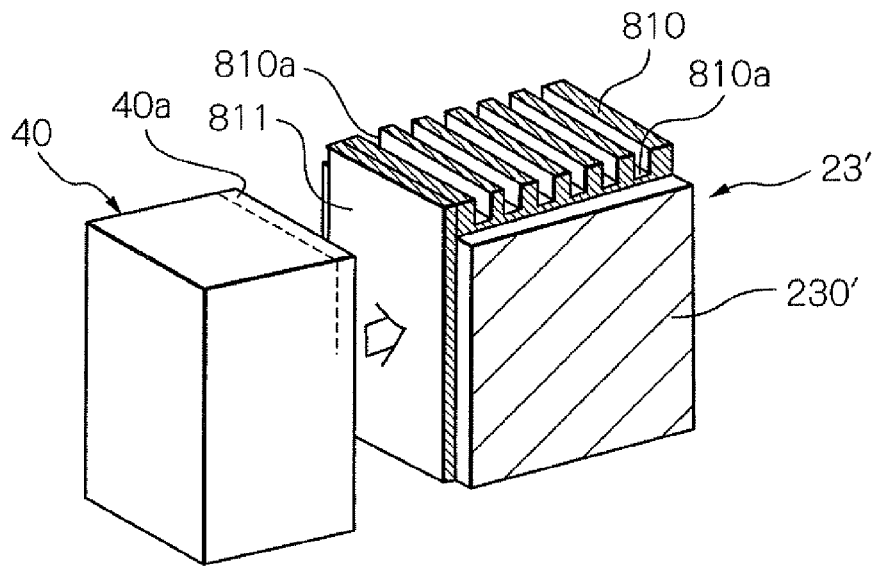
FIG. 8a shows a perspective view schematically illustrating another embodiment relating to unit electrodes of a light source unit.
Figure 8B:
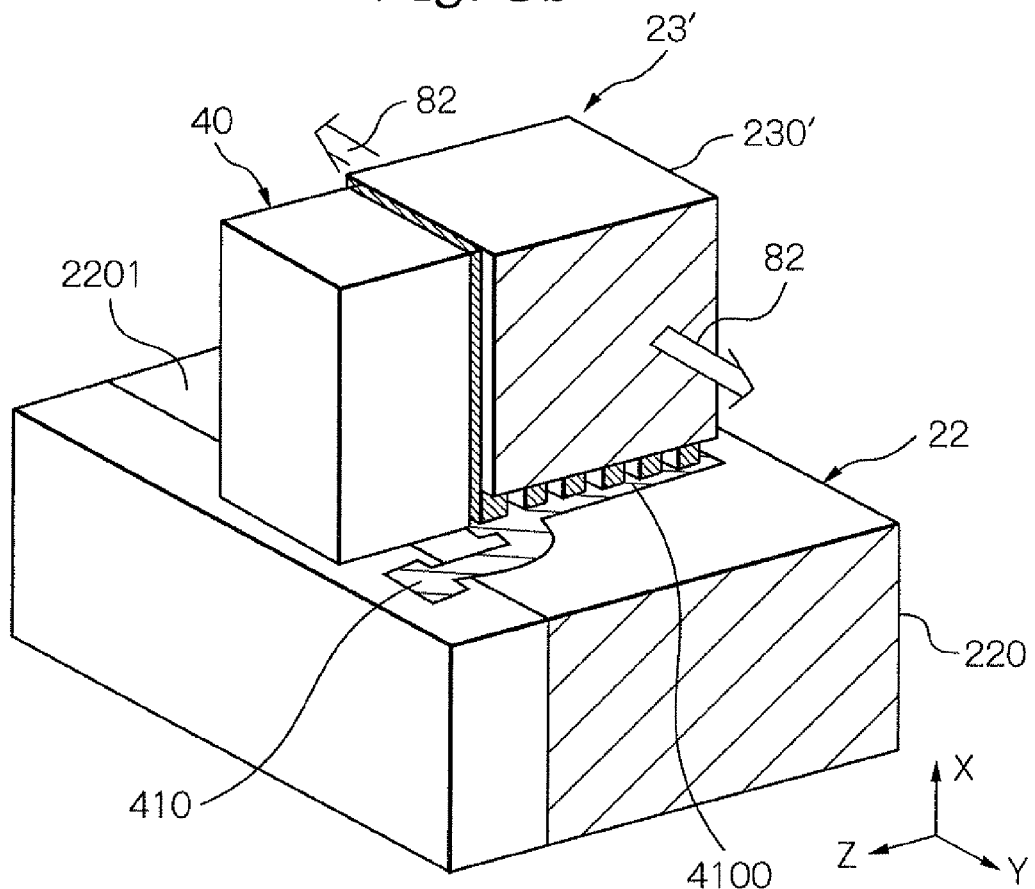
FIG. 8b shows a perspective view schematically illustrating an embodiment of the method for joining the light source unit illustrated in FIG. 8a onto a slider.

FIG. 8a shows a perspective view schematically illustrating another embodiment relating to unit electrodes of a light source unit. FIG. 8b shows a perspective view schematically illustrating an embodiment of the method for joining the light source unit 23' illustrated in FIG. 8a onto a slider 22.

Referring to FIG. 8a, the light source unit 23' includes: a unit substrate 230' on which first and second unit electrodes 810 and 811 are formed; and a laser diode 40 bonded to the second unit electrode 811. The first unit electrode 810 is formed by a gold (Au) layer or an Au alloy layer formed on a foundation layer, and includes multiple grooves 810a extending in the track width direction (Y-axis direction). The grooves 810a effectively functions when the light source unit 23' is joined to the slider 22 by Au—Au ultrasonic joining.

Referring to FIG. 8b, in the Au—Au ultrasonic joining, first the light source unit 23' is placed on the slider 22 in such a manner that the first unit electrode 810 is in contact with the back surface electrode 4100 formed on the back surface 2201 of the slider 22. The back surface electrode 4100 is formed of a gold (Au) layer or an Au alloy layer formed on a foundation layer. The light source unit 23' is then pressed against the back surface electrode 4100 under a predetermined pressure while applying an ultrasonic wave to the first unit electrode 810 and the back surface electrode 4100, and is vibrated in the directions indicated by arrow 82. As a result, the first unit electrode 810 and the back surface electrode 4100 are joined to each other. Since the grooves 810a extending in the direction of the vibration (Y-axis directions) are provided in the first unit electrode 810, instantaneous melting of Au is stably accomplished and the both electrodes are quickly and reliably joined together.

Tolerances in the mutual positioning (optical axis alignment) of the light source unit 23' and the slider 22 are, for example, on the order of submicrons in Z-axis direction whereas tolerances in the track width direction (Y-axis direction) are one order of magnitude greater than the tolerances in Z-axis direction. Accordingly, in the Au—Au ultrasonic joining, it is preferable that the grooves 810a extending in the track width direction (Y-axis direction) are provided and the light source unit 23' is vibrated in the track width direction (Y-axis direction) in which the tolerances are greater.

All the foregoing embodiments are by way of example of the present invention only and not intended to be limiting, and many widely different alternations and modifications of the present invention may be constructed without departing from the spirit and scope of the present invention. Accordingly, the present invention is limited only as defined in the following claims and equivalents thereto.

The invention claimed is:

1. A light source unit configured to form a thermally-assisted magnetic recording head by being joined with a slider including an optical system that is provided in an element-integration surface of a slider substrate and propagates a light for thermal assist, the light source unit comprising:
   a unit substrate including a joining surface that faces an electrode for power supply when the light source unit is joined to the slider, and a source-installation surface that is perpendicular to and adjacent to the joining surface, the electrode for power supply being provided on the side opposite to an opposed-to-medium surface of the slider substrate;
   a first electrode provided on the joining surface and a second electrode provided on the source-installation surface and electrically connected to the first electrode; and
   a light source including two electrode layers and a light-emission center that is located in a light-emitting surface adjacent to each of the two electrode layers and emits a light to be entered into the optical system, the light source being installed on the source-installation surface with one of the two electrode layers facing and being bonded onto the second electrode.

2. The light source unit as claimed in claim 1, wherein the light source is an edge-emitting laser diode, and is provided by bonding an electrode layer of the two electrode layers onto the second electrode, the electrode layer being opposite to a ridge structure.

3. The light source unit as claimed in claim 1, wherein a distance between a surface that includes the light-emission center of the light source and a surface of the first electrode in a direction perpendicular to the first electrode surface is zero or more, and 5 micrometers or less.

4. The light source unit as claimed in claim 1, wherein a plurality of grooves extending in a track width direction is provided in the first electrode.

5. The light source unit as claimed in claim 1, wherein a width of the unit substrate in a track width direction is greater than or equal to a width of the light source in the track width direction.

6. A thermally-assisted magnetic recording head comprising:
   a slider including: an optical system that is provided in an element-integration surface of a slider substrate and propagates a light for thermal assist; a write head element that is provided in the element integration surface and writes data on a magnetic recording medium; and an electrode for power supply provided on a side opposite to an opposed-to-medium surface of the slider substrate; and
   the light source unit as claimed in claim 1 joined with the slider by bonding the power-supply electrode of the slider onto the first electrode in such a manner that a light emitted from the light-emission center enters the optical system.

7. The thermally-assisted magnetic recording head as claimed in claim 6, wherein terminal electrodes for the write head element and a terminal electrode for the light source electrically connected with the power-supply electrode are provided on a side opposite to the opposed-to-medium surface of the slider substrate.

8. A head gimbal assembly comprising a suspension and the thermally-assisted magnetic recording head as claimed in claim 7 that is fixed to the suspension,
   a portion of an end surface of the slider substrate opposite to the opposed-to-medium surface being bonded to the suspension, the suspension comprising an aperture, the light source unit protruding from the aperture on a side opposite to the slider in relation to the suspension, and
   a wiring member being provided on a surface of the suspension on the slider side, one end of the wiring member being electrically connected with the terminal electrodes for the write head element and the terminal electrode for the light source.

9. A magnetic recording apparatus comprising: at least one head gimbal assembly as claimed in claim 8; at least one magnetic recording medium; and a control circuit configured to control write operations that the thermally-assisted magnetic recording head performs to the at least one magnetic recording medium, and to control light-emission operations of the light source.

10. A method for manufacturing the light source unit as claimed in claim 2, comprising the steps of:
   placing the light source on the unit substrate on which the first and second electrodes have been formed, in such a manner that the electrode layer positioned on the side opposite to the ridge structure faces the second electrode;
   positioning the light source and the unit substrate relative to each other by butting a portion of the light-emitting surface of the light source on the unit substrate side and at least a portion of a surface of the first electrode against a flat surface of a positioning jig, the portion of the light-emitting surface not including the light-emission center; and bonding the positioned light source and the unit substrate to each other.

* * * * *